United States Patent
Wu et al.

(10) Patent No.: US 12,224,278 B2
(45) Date of Patent: *Feb. 11, 2025

(54) ACTIVE ZONES WITH OFFSET IN SEMICONDUCTOR CELL

(71) Applicant: TAIWAN SEMICONDUCTOR MANUFACTURING COMPANY, LTD., Hsinchu (TW)

(72) Inventors: Guo-Huei Wu, Hsinchu (TW); Chih-Liang Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/523,023

(22) Filed: Nov. 29, 2023

(65) Prior Publication Data
US 2024/0096866 A1    Mar. 21, 2024

Related U.S. Application Data

(63) Continuation of application No. 17/213,980, filed on Mar. 26, 2021, now Pat. No. 11,855,068.

(51) Int. Cl.
| | |
|---|---|
| *H01L 23/528* | (2006.01) |
| *G06F 30/392* | (2020.01) |
| *G06F 30/394* | (2020.01) |
| *H01L 27/02* | (2006.01) |
| *H01L 27/092* | (2006.01) |
| *H01L 29/06* | (2006.01) |
| *H01L 29/423* | (2006.01) |

(Continued)

(52) U.S. Cl.
CPC ........ *H01L 27/0207* (2013.01); *G06F 30/392* (2020.01); *G06F 30/394* (2020.01); *H01L 23/5286* (2013.01); *H01L 27/092* (2013.01); *H01L 29/0673* (2013.01); *H01L 29/42392* (2013.01); *H01L 29/775* (2013.01); *H01L 29/78696* (2013.01)

(58) Field of Classification Search
CPC ............. H01L 27/0207; H01L 23/5286; H01L 27/092; H01L 29/0673; H01L 29/42392; H01L 29/775; H01L 29/78696; H01L 21/823871; H01L 23/528; G06F 30/392; G06F 30/394
USPC ......................................................... 257/351
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 11,855,068 B2 * | 12/2023 | Wu | ...................... H01L 29/0673 |

(Continued)

*Primary Examiner* — Tong-Ho Kim
(74) *Attorney, Agent, or Firm* — Hauptman Ham, LLP

(57) ABSTRACT

An integrated circuit includes first-type transistors aligned within a first-type active zone, second-type transistors aligned within a second-type active zone, a first power rail and a second power rail extending in a first direction. A first distance between the long edge of the first power rail and the first alignment boundary of the first-type active zone is different from a second distance between the long edge of the second power rail and the first alignment boundary of the second-type active zone. Each of the first distance and the second distance is along a second direction which is perpendicular to the first direction.

20 Claims, 19 Drawing Sheets

(51) Int. Cl.
*H01L 29/775* (2006.01)
*H01L 29/786* (2006.01)

(56) References Cited

U.S. PATENT DOCUMENTS

| | | |
|---|---|---|
| 2014/0040838 A1 | 2/2014 | Liu et al. |
| 2015/0278429 A1 | 10/2015 | Chang |
| 2017/0053917 A1 | 2/2017 | Azmat et al. |
| 2020/0395354 A1 | 12/2020 | Lee et al. |

* cited by examiner

ACTIVE ZONES WITH OFFSET IN SEMICONDUCTOR CELL

CROSS-REFERENCE TO RELATED APPLICATIONS

The present application is a continuation of U.S. application Ser. No. 17/213,980, filed Mar. 26, 2021, now U.S. Pat. No. 11,855,068, issued Dec. 26, 2023, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in more strict restriction on the layout design of the IC circuits. When horizontal routing tracks parallel to power rails are designed for connecting to various gate terminals, source terminals, and drain terminals of the transistors in a cell structure, the number of horizontal routing tracks available for the connection is limited. The locations of the via connectors for connecting the horizontal routing tracks to various gate terminals, source terminals, and drain terminals of the transistors in a cell structure are also subject to design rule restrictions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
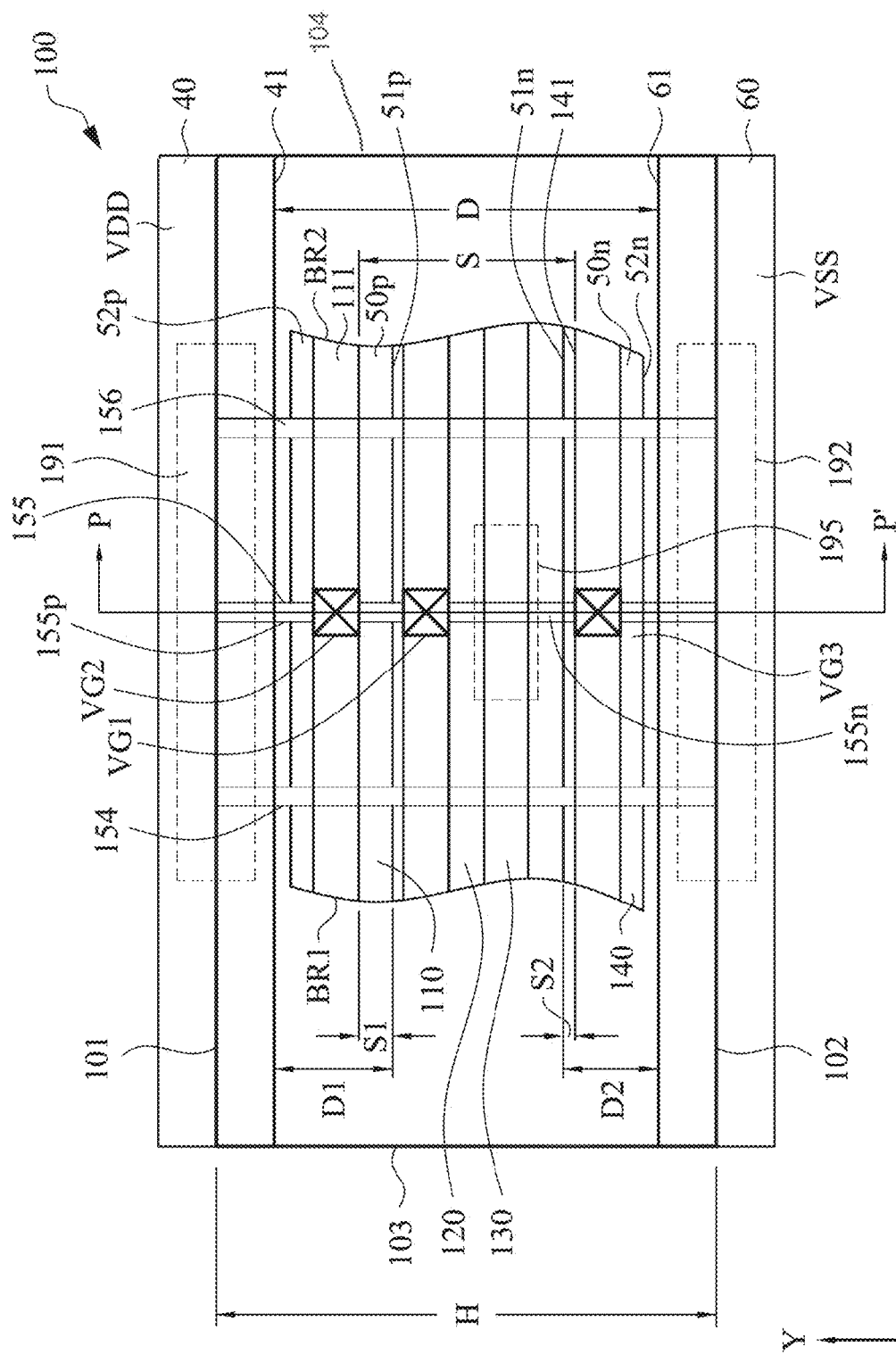
FIG. 1A is a partial layout diagram of a semiconductor cell structure having two transistors, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The layout design of an IC circuit often includes the layout designs of many cells. Each of the cells in the layout design specifies how a corresponding semiconductor cell structure is fabricated. A cell in a layout diagram often includes a p-type active zone and an n-type active zone. The p-type active zone as drawn in a layout diagram is a region between a first alignment boundary and a second alignment boundary for aligning the channel regions, the source regions, and the drain regions of the p-channel field effect transistors (p-type transistors) in the cell. The n-type active zone as drawn in a layout diagram is a region between a first alignment boundary and a second alignment boundary for aligning the channel regions, the source regions, and the drain regions of the n-channel field effect transistors (n-type transistors) in the cell. In a fabricated semiconductor device, the first alignment boundary and the second alignment boundary of each type of the active zones is identifiable by identifying various aligned boundaries of the source regions, the drain regions, and/or the channel regions of the transistors of the same type. Consequently, each active zone between the corresponding first alignment boundary and the corresponding second alignment boundary is also identifiable in the fabricated semiconductor device.

In some layout designs of the IC circuits, the separation between the p-type active zone and a first power rail (e.g., the power rail for VDD) is closely matched with the separation between the n-type active zone and a second power rail (e.g., the power rail for VSS). Various matched designs of the active zones may inadvertently create restrictions on the locations of the via connectors for connecting the horizontal routing tracks to various gate terminals, source terminals, and drain terminals of the transistors in a cell design. When the p-type active zone and the n-type active zone are designed with a predetermined offset, design rule restriction on the locations of some via connectors is relaxed or improved.

Figure 1B:
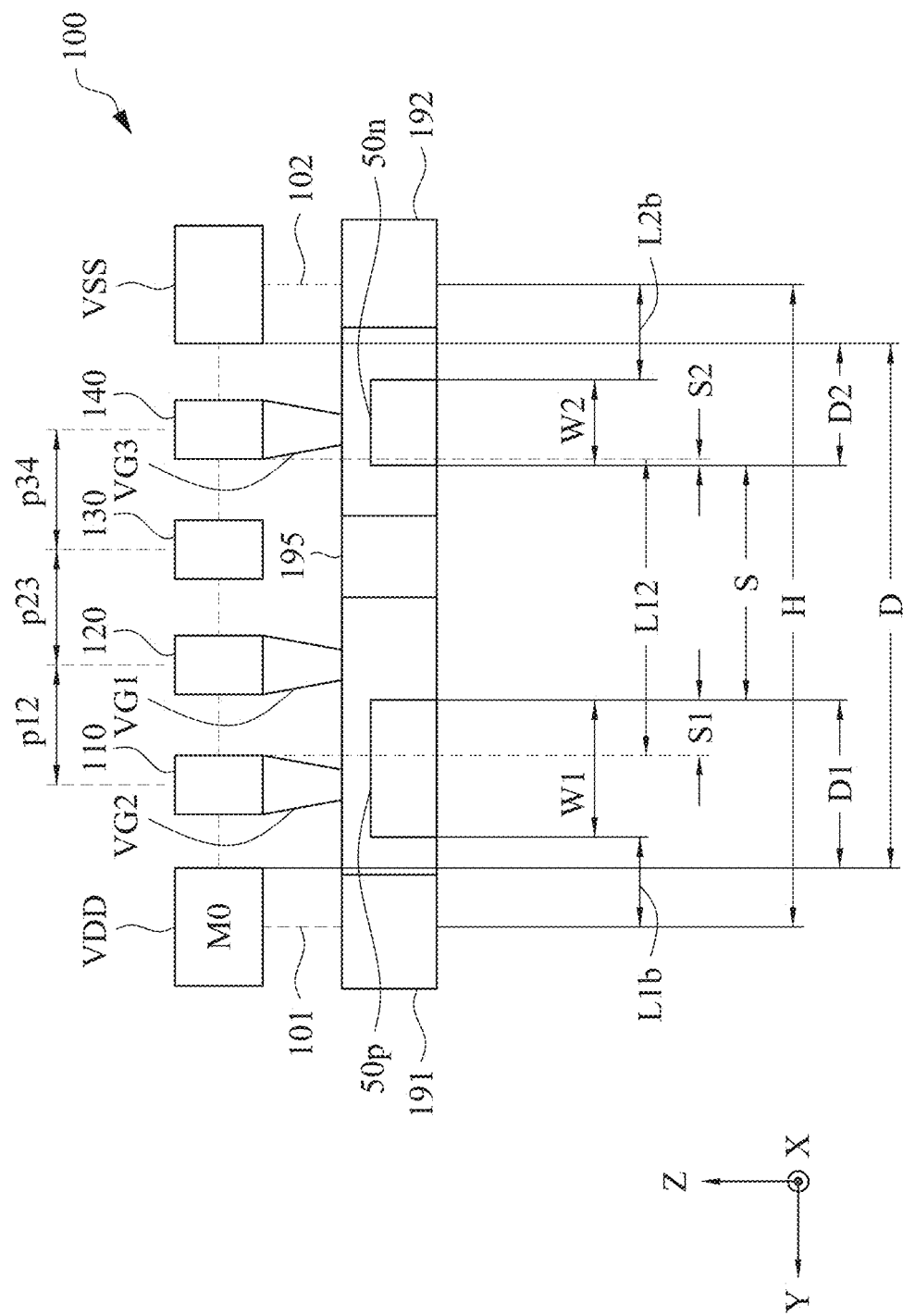
FIG. 1B is a cross-sectional view of the semiconductor cell structure along cutting line PP' in FIG. 1A, in accordance with some embodiments.

FIG. 1A is a partial layout diagram of a semiconductor cell structure 100, in accordance with some embodiments. FIG. 1B is a cross-sectional view of the semiconductor cell structure 100 along cutting line P-P' in FIG. 1A, in accordance with some embodiments. The semiconductor cell structure 100 includes two active zones (e.g., 50p and 50n) extending in the X-direction and four routing tracks (e.g., 110, 120, 130, and 140) extending in the X-direction. Within the four boundaries (e.g., 101, 102, 103, and 104) of the semiconductor cell structure 100, portions of the active zones and the routing tracks between the broken lines BR1 and BR2 are depicted in the layout diagram of FIG. 1A. In some alterative embodiments, the semiconductor cell structure 100 includes more than four routing tracks extending in the X-direction. In some alterative embodiments, the semiconductor cell structure 100 includes less than four routing tracks extending in the X-direction.

The two active zones in FIGS. 1A-1B include a p-type active zone 50p and an n-type active zone 50n. The p-type active zone 50p has a first alignment boundary 51p and a second alignment boundary 52p each extending in the X-direction. The n-type active zone 50n has a first alignment boundary 51n and a second alignment boundary 52n each extending in the X-direction. The first alignment boundary 51p of the p-type active zone 50p neighbors the first alignment boundary 51n of the n-type active zone 50n. The p-type active zone 50p and the n-type active zone 50n are separated from each other in the Y-direction which is perpendicular to the X-direction. The p-type active zone 50p has a width W1, and the n-type active zone 50n has a width W2. The first alignment boundary 51p of the p-type active zone 50p and the first alignment boundary 51n of the n-type active zone 50n are separated by a distance L12 along the Y-direction. The second alignment boundary 52p of the p-type active zone 50p and the first boundary 101 of the semiconductor cell structure 100 are separated by a distance L1b along the Y-direction. The second alignment boundary 52n of the n-type active zone 50n and the second boundary 102 of the semiconductor cell structure 100 are separated by a distance L2b along the Y-direction.

In FIGS. 1A-1B, the distance between the first boundary 101 and the second boundary 102 along the Y-direction is the height H of the cell. In some design of the cell, if the p-type active zone 50p and the n-type active zone 50n are implemented without offset, design rules impose additional restrictions on the positions of the via connectors for connecting with the routing tracks (e.g., 110, 120, 130, and 140) when the height H of the cell is smaller than a threshold cell height. In FIGS. 1A-1B, the p-type active zone 50p and the n-type active zone 50n are implemented with offset. For example, the width W1 is within a range from 0.18H to 0.20H, while the width W2 is within a range from 0.10H to 0.12H. In the example, the distance L1b is within a range from 0.17H to 0.19H, and the distance L2b is within a range from 0.17H to 0.19H, and the distance L12 is within a range from 0.35H to 0.39H. In some embodiments, the offset of the active zones (e.g., 50p and 50n) is implemented for cells having the height H less than 500 nanometers. In some embodiments, the offset of the active zones (e.g., 50p and 50n) is implemented for cells having the height H less than 400 nanometers. In some embodiments, the offset of the active zones (e.g., 50p and 50n) is implemented for cells having the height H less than 300 nanometers.

In FIGS. 1A-1B, the semiconductor cell structure 100 further includes a first power rail 40 and a second power rail 60 each extending in the X-direction. The first power rail 40 has a long edge 41 adjacent the p-type active zone 50p. The second power rail 60 has a long edge 61 adjacent the n-type active zone 50n. The separation distance D between the long edge 41 of the first power rail 40 and the long edge 61 of the second power rail 60 along the Y-direction is less than 500 nanometers. In some embodiments, the separation distance D is less than 400 nanometers. In some embodiments, the separation distance D is less than 300 nanometers. A first distance D1 along the Y-direction between the long edge 41 of the first power rail 40 and the first alignment boundary 51p of the p-type active zone is larger than a second distance D2 along the Y-direction between the long edge 61 of the second power rail and the first alignment boundary 51n of the n-type active zone 50n by a predetermined distance. In some embodiments, the predetermined distance is at least 10% of the separation distance D of the power rails, which is D1-D2≥0.1D. In some embodiments, the predetermined distance is at least 20% of the separation distance D of the power rails, which is D1-D2≥0.2D. When the predetermined distance D1-D2 is sufficiently large, some design rule restrictions on the positions of the via connectors for connecting with the routing tracks (e.g., 110, 120, 130, and 140) are relaxed. In some embodiments, a first separation distance along the Y-direction from the long edge 61 of the first power rail to the second alignment boundary 52p of the p-type active zone 50p is identical to a second separation distance along the Y-direction from the long edge of the second power rail to the second alignment boundary 52n of the n-type active zone 50n. In some embodiments, a first separation distance along the Y-direction from the long edge 61 of the first power rail to the second alignment boundary 52p of the p-type active zone 50p is different from a second separation distance along the Y-direction from the long edge of the second power rail to the second alignment boundary 52n of the n-type active zone 50n.

In FIGS. 1A-1B, among the four routing tracks (e.g., 110, 120, 130, and 140), two inner routing tracks (e.g., 120 and 130) are neighbors, and the two inner routing tracks are positioned between a first outer routing track 110 and a second outer routing track 140. In some embodiments, the four routing tracks (e.g., 110, 120, 130, and 140) have equal track width along the Y-direction and are separated by identical distances. (e.g., p12=p23=p34). The first outer routing track 110 has an inner side 111, extending in the X-direction, adjacent one of two the inner routing tracks (e.g., 120). The second outer routing track 140 has an inner side 141, extending in the X-direction, adjacent the other one of the inner routing tracks (e.g., 130). The separation distance S between the inner side 111 of the first outer routing track 110 and the inner side 141 of second outer routing track 140 along the Y-direction is less than 500 nanometers. In some embodiments, the separation distance S is less than 400 nanometers. In some embodiments, the separation distance S is less than 300 nanometers. A first distance S1 along the Y-direction between the inner side 111 of the first outer routing track 110 and the first alignment boundary 51p of the p-type active zone 50p is larger than a second distance S2 along the Y-direction between the inner side 141 of the second outer routing track 140 and the first alignment boundary 51n of the n-type active zone 50n by a predetermined distance. In some embodiments, the predetermined distance is at least 10% of the separation distance S between the inner sides (e.g., 111 and 141) of the outer routing tracks, which is S1-S2≥0.1S. In some embodiments, the predetermined distance is at least 20% of the separation distance S of the power rails, which is S1-S2≥0.2S. When the predetermined distance S1-S2 is sufficiently large, some design rule restrictions on the positions of the via connectors for connecting with the routing tracks (e.g., 110, 120, 130, and 140) are relaxed.

In FIGS. 1A-1B, the semiconductor cell structure 100 further includes multiple gate-strips (e.g., 154, 155, and 156) extending in the Y-direction. In the partial layout diagram in FIG. 1A, poly-cut patterns 191 and 192 are positioned near two boundaries of the semiconductor cell structure 100, and a poly-cut pattern 195 is positioned within the boundaries of the semiconductor cell structure 100. The poly-cut pattern 191 is positioned near the first boundary 101 and specifies that the gate-strips 154, 155, and 156 are terminated before the gate-strips cross the first boundary 101, which prevents the gate-strips directly extending to a neighboring cell on the other side of the first boundary 101. The poly-cut pattern 192 is positioned near the second boundary 102 and specifies that the gate-strips 154, 155, and 156 are terminated before the gate-strips cross the second boundary 102, which prevents the gate-strips directly extending to a neighboring cell on the other side of the second boundary 102. The poly-cut pattern 195 is positioned over the gate-strip 155 to divide the gate-strip 155 into a first gate-strip segment 155p and a second gate-strip segment 155n. The first gate-strip segment 155p intersects the p-type active zone 50p over a channel region of a p-channel field effect transistor, and the second gate-strip segment 155n intersects the n-type active zone 50n over a channel region of an n-channel field effect transistor. The p-channel field effect transistor formed within the p-type active zone 50p is either a nanosheet transistor or a nanowire transistor. The n-channel field effect transistor formed within the n-type active zone 50n is also either a nanosheet transistor or a nanowire transistor. Nanosheet transistors and nanowire transistors are provided as examples for the transistors formed over the active zones in FIGS. 1A-1B. Other types of transistors that are compatible with nanosheet transistors and nanowire transistors for use in the semiconductor cell structure 100 in FIGS. 1A-1B are also within the contemplated scope of the instant disclosure.

In FIGS. 1A-1B, the semiconductor cell structure 100 further includes multiple via connectors (e.g., VG1, VG2, and VG3). The via connector VG1 connects the first gate-strip segment 155p to the inner routing track 120. The via connector VG2 connects the first gate-strip segment 155p to the first outer routing track 110. The via connector VG3 connects the second gate-strip segment 155n to the second outer routing track 140. In some embodiments, the semiconductor cell structure 100 does not include the via connector VG2 for connecting the first gate-strip segment 155p to the first outer routing track 110. In some embodiments, the semiconductor cell structure 100 does not include the via connector VG3 for connecting the second gate-strip segment 155n to the second outer routing track 140. When the position offset along the Y-direction between the p-type active zone 50p and the n-type active zone 50n (e.g., as measured by the predetermined distances D1-D2 or S1-S2) becomes sufficiently large, it is possible to remove some design rule violations associated with the position of the via connector VG1 that connects the first gate-strip segment 155p to the inner routing track 120.

In the embodiment as shown in FIGS. 1A-1B, the semiconductor cell structure 100 includes a via connector VG1 that connects the first gate-strip segment 155p to the inner routing track 120. In some alternative embodiments as shown in FIGS. 2A-2B, the semiconductor cell structure 100 includes a via connector VG1 that connects the second gate-strip segment 155n to the inner routing track 130.

Figure 2A:
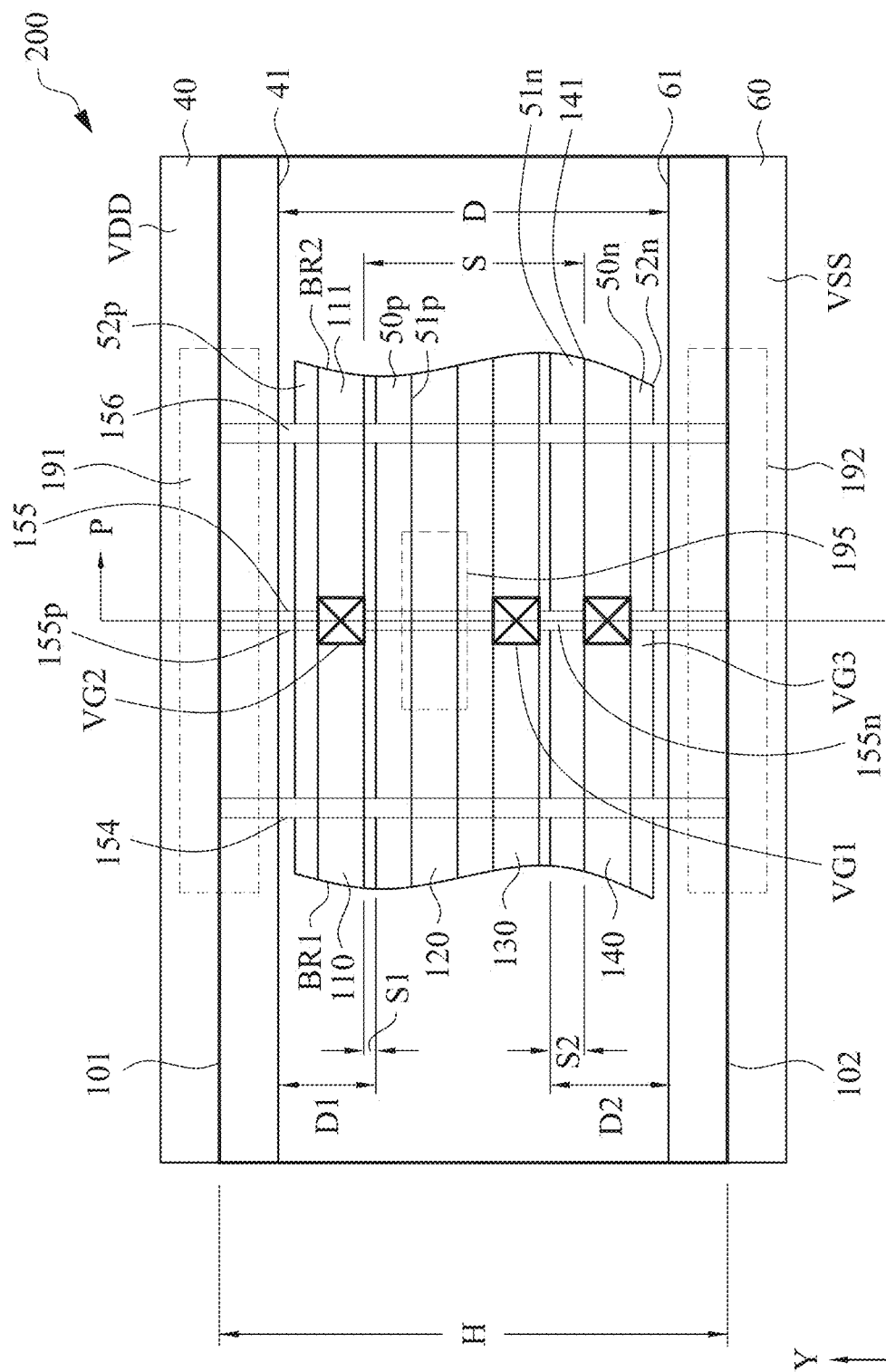
FIG. 2A is a partial layout diagram of a semiconductor cell structure, in accordance with some alternative embodiments.
Figure 2B:
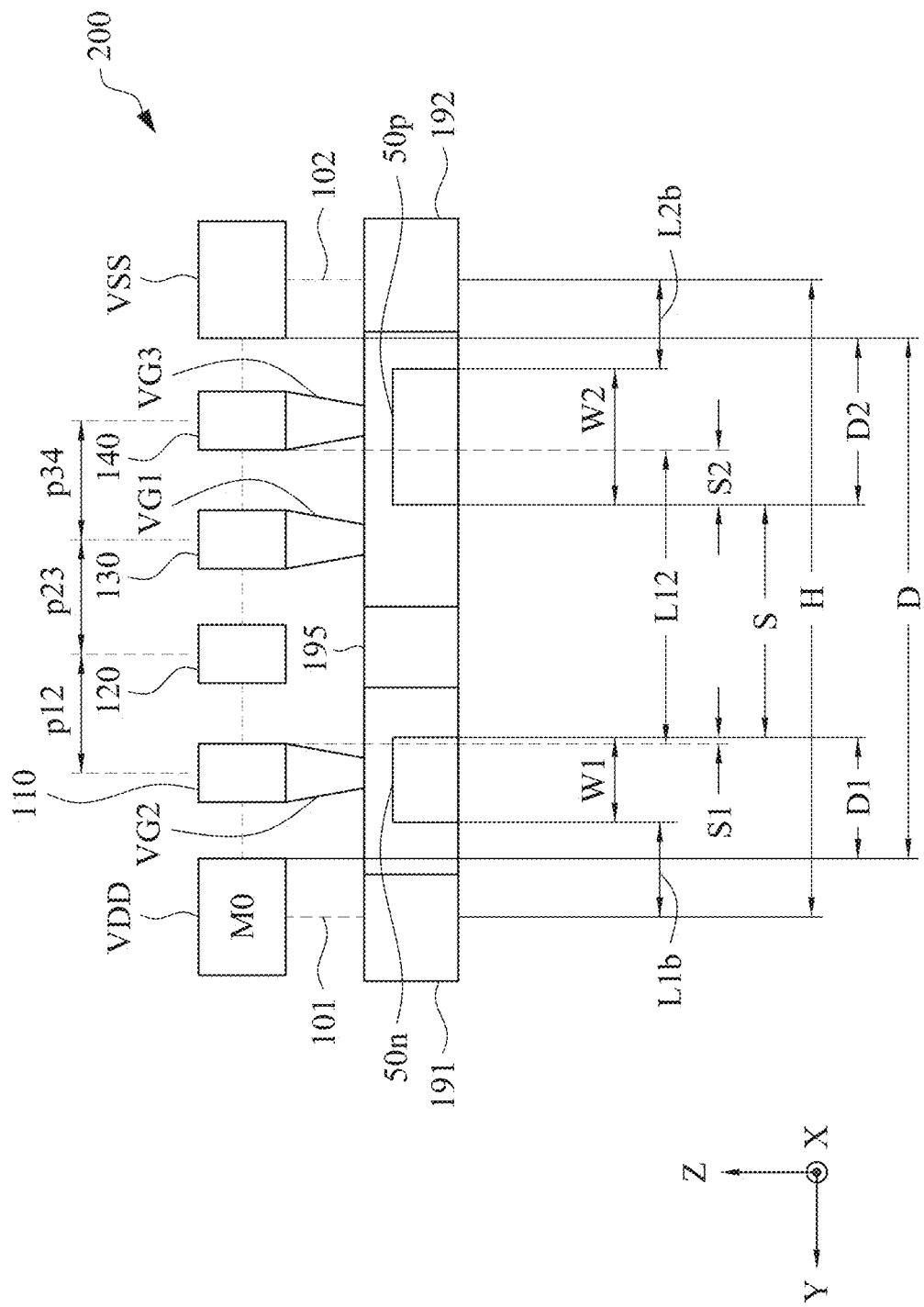
FIG. 2B is a cross-sectional view of the semiconductor cell structure along cutting line PP' in FIG. 2A, in accordance with some alternative embodiments.

FIG. 2A is a partial layout diagram of a semiconductor cell structure 100, in accordance with some alternative embodiments. FIG. 2B is a cross-sectional view of the semiconductor cell structure 100 along cutting line P-P' in FIG. 2A, in accordance with some alternative embodiments. Similar to the semiconductor cell structure 100 in FIGS. 1A-1B, the semiconductor cell structure 200 in FIGS. 2A-2B also includes two active zones (e.g., 50p and 50n) extending in the X-direction, four routing tracks (e.g., 110, 120, 130, and 140) extending in the X-direction, two power rails (e.g., 40 and 60) extending in the X-direction, and multiple gate-strips (e.g., 154, 155, and 156) extending in the Y-direction. The gate-strip 155 includes a first gate-strip segment 155p and a second gate-strip segment 155n.

In both FIGS. 1A-1B and FIGS. 2A-2B, the separation distance D between the long edge 41 of the first power rail 40 and the long edge 61 of the second power rail 60 along the Y-direction is less than 500 nanometers. In some embodiments, the separation distance D is less than 400 nanometers. In some embodiments, the separation distance D is less than 300 nanometers. For the semiconductor cell structures 100 in FIGS. 1A-1B, a first distance D1 along the Y-direction between the long edge 41 of the first power rail 40 and the first alignment boundary 51p of the p-type active zone is larger than a second distance D2 along the Y-direction between the long edge 61 of the second power rail and the first alignment boundary 51n of the n-type active zone 50n by a predetermined distance. In contrast, for the semiconductor cell structures 200 in FIGS. 2A-2B, a first distance D1 along the Y-direction between the long edge 41 of the first power rail 40 and the first alignment boundary 51p of the p-type active zone is smaller than a second distance D2 along the Y-direction between the long edge 61 of the second power rail and the first alignment boundary 51n of the n-type active zone 50n by a predetermined distance. In some embodiments, the predetermined distance is at least 10% of the separation distance D of the power rails, which is D2-D1≥0.1D. In some embodiments, the predetermined distance is at least 20% of the separation distance D of the power rails, which is D2-D1≥0.2D. When the predetermined distance D2-D1 is sufficiently large, some design rule restrictions on the positions of the via connectors for connecting with the routing tracks (e.g., 110, 120, 130, and 140) are relaxed.

In both FIGS. 1A-1B and FIGS. 2A-2B, the separation distance S between the inner side 111 of the first outer routing track 110 and the inner side 141 of second outer routing track 140 along the Y-direction is less than 500 nanometers. In some embodiments, the separation distance S is less than 400 nanometers. In some embodiments, the separation distance S is less than 300 nanometers. For the semiconductor cell structures 100 in FIGS. 1A-1B, a first distance S1 along the Y-direction between the inner side 111 of the first outer routing track 110 and the first alignment boundary 51p of the p-type active zone 50p is larger than a second distance S2 along the Y-direction between the inner side 141 of the second outer routing track 140 and the first alignment boundary 51n of the n-type active zone 50n by a predetermined distance. In contrast, for the semiconductor cell structures 200 in FIGS. 2A-2B, a first distance S1 along the Y-direction between the inner side 111 of the first outer routing track 110 and the first alignment boundary 51p of the p-type active zone 50p is smaller than a second distance S2 along the Y-direction between the inner side 141 of the second outer routing track 140 and the first alignment boundary 51n of the n-type active zone 50n by a predetermined distance. In some embodiments, the predetermined distance is at least 10% of the separation distance S between the inner sides (e.g., 111 and 141) of the outer routing tracks, which is S2-S1≥0.1S. In some embodiments, the predetermined distance is at least 20% of the separation distance S of the power rails, which is S2-S1≥0.2S. When the predetermined distance S2-S1 is sufficiently large, some design rule restrictions on the positions of the via connectors for connecting with the routing tracks (e.g., 110, 120, 130, and 140) are relaxed.

Like the semiconductor cell structures 100 in FIGS. 1A-1B, the semiconductor cell structure 200 in FIGS. 2A-2B also includes multiple via connectors (e.g., VG1, VG2, and VG3). The via connector VG1 in FIGS. 2A-2B, however, connects a different gate-strip segment to a different inner routing track. In FIGS. 1A-1B, the via connector VG1 connects the first gate-strip segment 155p to the inner routing track 120. In FIGS. 2A-2B, the via connector VG1 connects the second gate-strip segment 155n to the inner routing track 130. In both FIGS. 1A-1B and FIGS. 2A-2B, the via connector VG2 connects the first gate-strip segment 155p to the first outer routing track 110. The via connector VG3 connects the second gate-strip segment 155n to the second outer routing track 140. In some embodiments, the semiconductor cell structure 100 does not include the via connector VG2 for connecting the first gate-strip segment 155p to the first outer routing track 110. In some embodiments, the semiconductor cell structure 100 does not include the via connector VG3 for connecting the second gate-strip segment 155n to the second outer routing track 140.

In both FIGS. 1A-1B and FIGS. 2A-2B, the first gate-strip segment 155p intersects the p-type active zone 50p and forms a gate of the p-channel field effect transistor in the p-type active zone 50p, and the second gate-strip segment 155n intersects the n-type active zone 50n and forms a gate of the n-channel field effect transistor in the n-type active zone 50n. Specifically, in FIGS. 1A-1B, the via connector VG1 and the via connector VG2 enable the gate of the p-channel field effect transistor be connected to one or both of the routing tracks 110 and 120 through the first gate-strip segment 155p, while the via connector VG3 enables the gate of the n-channel field effect transistor to be connected to the routing track 140 through the second gate-strip segment 155n. In FIGS. 2A-2B, the via connector VG1 and the via connector VG3 enable the gate of the n-channel field effect transistor to be connected to one or both of the routing tracks 130 and 140 through the second gate-strip segment 155n, while the via connector VG2 enables the gate of the p-channel field effect transistor to be connected to the routing track 110 through the first gate-strip segment 155p. When the position offset along the Y-direction between the p-type active zone 50p and the n-type active zone 50n (e.g., as measured by the predetermined distances D2-D1 or S2-S1) becomes sufficiently large, it is possible to remove some design rule violations associated with the position of the via connector VG1 that connects the second gate-strip segment 155n to the routing track 130.

The availability of the via connectors (VG1, VG2, and VG3) for connecting the routing tracks to the gate-strip segments of a same gate-strip provides some routing flexibility for forming various circuits in the semiconductor cell structures. The routing flexibility enables semiconductor cell structures to be designed with reduced cell widths, as compared with some alternative designs in which no via connector is available to connect one of the two inner routing tracks (e.g., 120 or 130) to the gate of the transistor under the same the gate-strip (e.g., 155) that is already connected to one or both of the two outer routing tracks (e.g., 110 and/or 140). Examples of semiconductor cell structures with reduced cell widths are shown in FIGS. 3A-3D and in FIGS. 4A-4D.

Figure 3A:
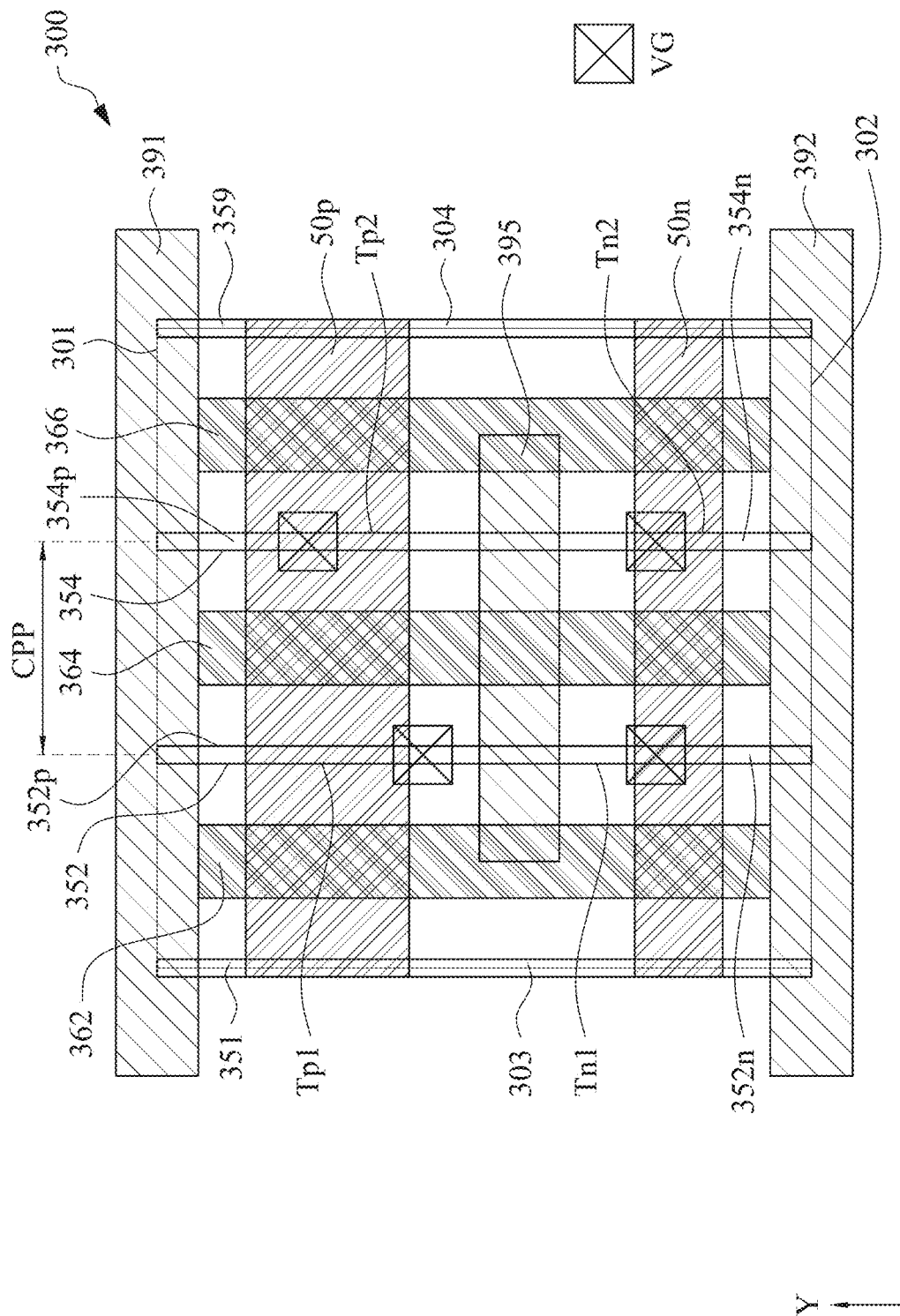
FIGS. 3A-3C are partial layout diagrams of a semiconductor cell structure having four transistors, in accordance with some embodiments.
Figure 3B:
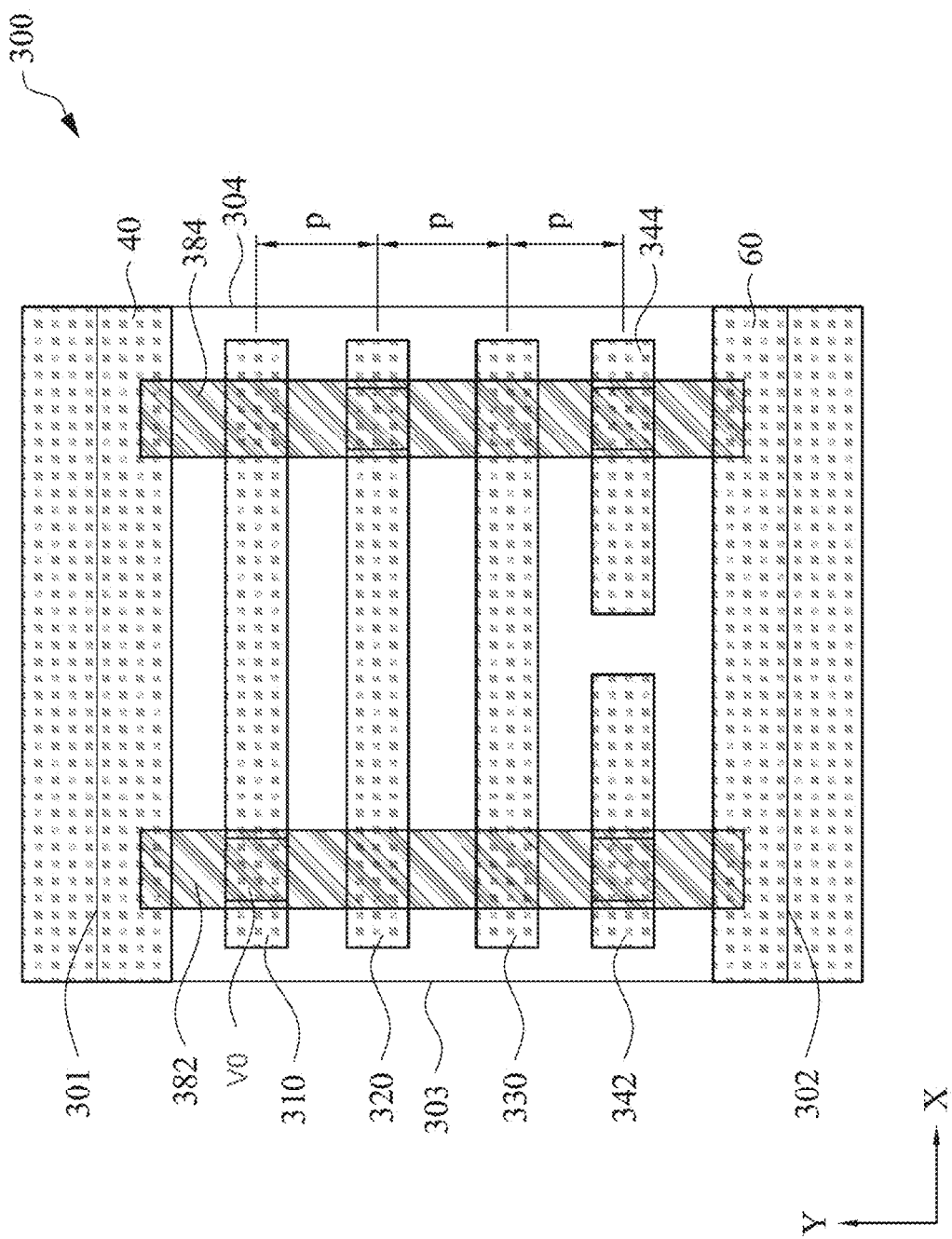
Figure 3C:
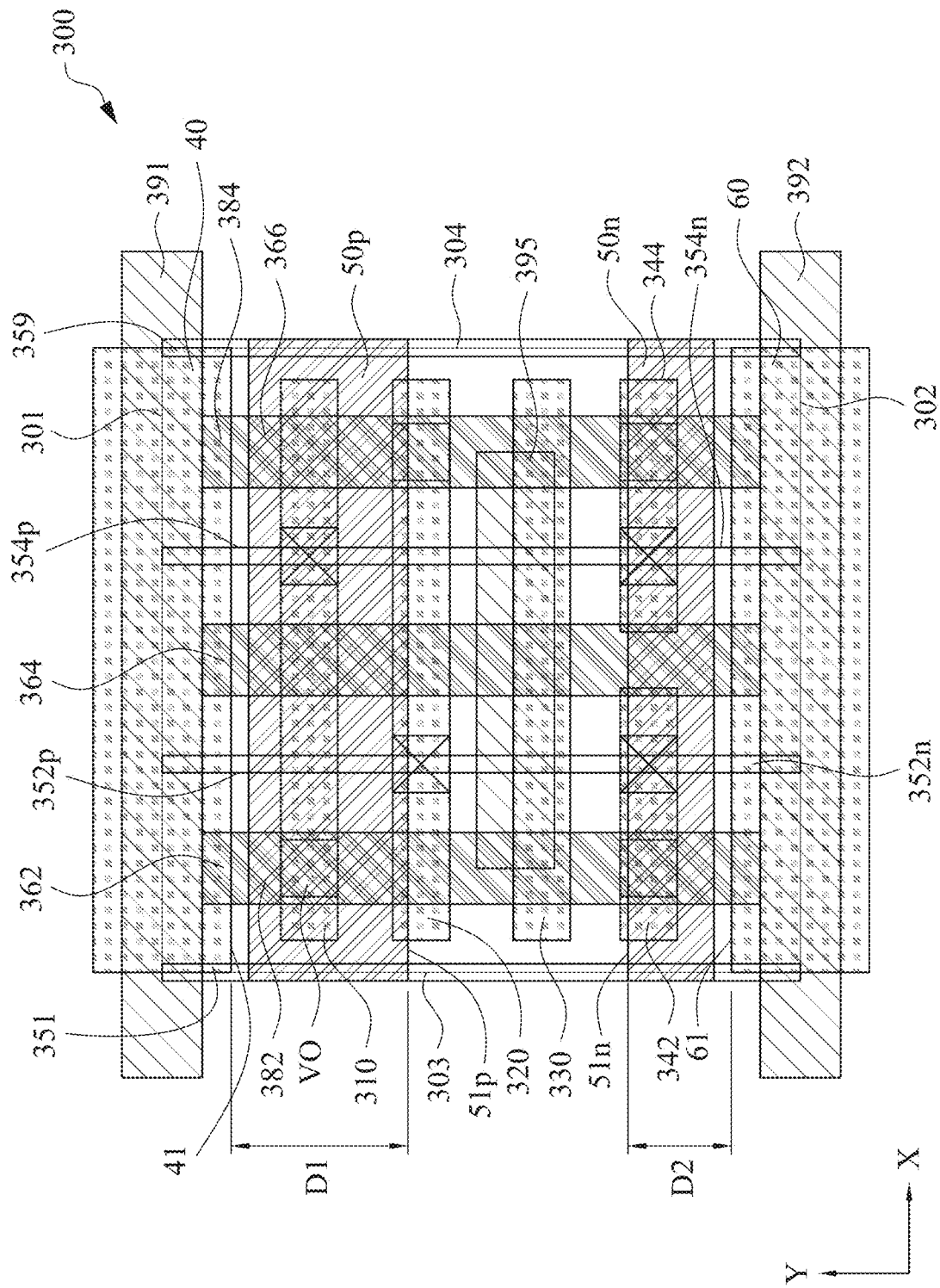

FIGS. 3A-3C are partial layout diagrams of a semiconductor cell structure 300, in accordance with some embodiments. The partial layout diagrams of FIGS. 3A-3C include various layout elements of the semiconductor cell structure 300 within cell boundaries 301, 302, 303, and 304. Specifically, in FIG. 3A, the semiconductor cell structure 300 includes the p-type active zone 50p, the n-type active zone 50n, and poly-cut patterns (e.g., 391 392, and 395).

The semiconductor cell structure 300 also includes four gate-strips (e.g., 351, 352, 354, and 359) and three conductive segments (e.g., 362, 364, and 366). In some embodiments, the four gate-strips (e.g., 351, 352, 354, and 359) are separated by identical pitch distances, and the pitch distance between two adjacent gate-strips is one contacted poly pitch (CPP). The poly-cut patterns 391 and 392 terminate the four gate-strips (e.g., 351, 352, 354, and 359) near the horizontal boundaries 301 and 302 of the semiconductor cell structure 300. The poly-cut pattern 395 divides the gate-strip 352 into the gate-strip segments 352p and 352n. The poly-cut pattern 395 also divides the gate-strip 354 into the gate-strip segments 354p and 354n. In some embodiments, the gate-strips 351 and 359 are dummy gate-strips which are not used for forming gates of transistors.

In FIG. 3A, the gate-strip segments 352p and 354p intersect the p-type active zone 50p and correspondingly form the gate of the p-channel field effect transistor Tp1 and the gate of the p-channel field effect transistor Tp2. The gate-strip segments 352n and 354n intersect the n-type active zone 50n and correspondingly form the gate of the n-channel field effect transistor Tn1 and the gate of the n-channel field effect transistor Tn2. The conductive segment 362 intersects the p-type active zone 50p while forming the conductive contact with a first source/drain terminal of the p-channel field effect transistor Tp1. The conductive segment 362 also intersects the n-type active zone 50n while forming the conductive contact with a first source/drain terminal of the n-channel field effect transistor Tn1. The conductive segment 366 intersects the p-type active zone 50p while forming the conductive contact with a first source/drain terminal of the p-channel field effect transistor Tp2. The conductive segment 366 also intersects the n-type active zone 50n while forming the conductive contact with a first source/drain terminal of the n-channel field effect transistor Tn2. The conductive segment 364 intersects the p-type active zone 50p while forming the conductive contact with the second source/drain terminals of the p-channel field effect transistors Tp1 and Tp2. The conductive segment 364 also intersects the n-type active zone 50n while forming the conductive contact with the second source/drain terminals of the n-channel field effect transistors Tn1 and Tn2. In FIG. 3A, the semiconductor cell structure 300 also includes four via connectors VG for connecting each of the gate-strip segments 352p, 354p, 352n, and 354n to a corresponding routing tracks extending in the X-direction.

FIG. 3B is a partial layout diagram of the routing tracks, power rails, and via connectors in the semiconductor cell structure 300, in accordance with some embodiments. Specifically, the semiconductor cell structure 300 includes horizontal routing tracks 310, 320, 330, 342, and 342 extending in the X-direction and vertical routing tracks 382 and 384 extending in the Y-direction. In some embodiments, horizontal routing tracks 310, 320, 330, 342 have equal track width along the Y-direction and are separated by identical pitch distances. The semiconductor cell structure 300 also includes power rails 40 and 60 extending in the X-direction. In some embodiments, the horizontal routing tracks (e.g., 310, 320, 330, 342, and 342) are fabricated in a first metal layer (e.g., sometimes labeled as M0 layer) overlying the interlayer dielectric (ILD) that covers the gate-strip segments connecting the gate terminals and the conductive segments connecting the source/drain terminals, while the vertical routing tracks (e.g., 382 and 384) are fabricated in a second metal layer (e.g., sometimes labeled as M1 layer) on the inter-metal dielectric (IMD) between the first metal layer and the second metal layer. In some embodiments, the power rails 40 and 60 are fabricated in the first metal layer (e.g., sometimes labeled as M0 layer). In some alternative embodiments, the power rails 40 and 60 are fabricated as buried power rails located below the first metal layer. In FIG. 3B, the semiconductor cell structure 300 also includes four via connectors VO. Two via connectors VO connect the vertical routing track 382 to the horizontal routing tracks 310 and 342, and two via connectors VO connect the vertical routing track 384 to the horizontal routing tracks 320 and 344.

Figure 3D:
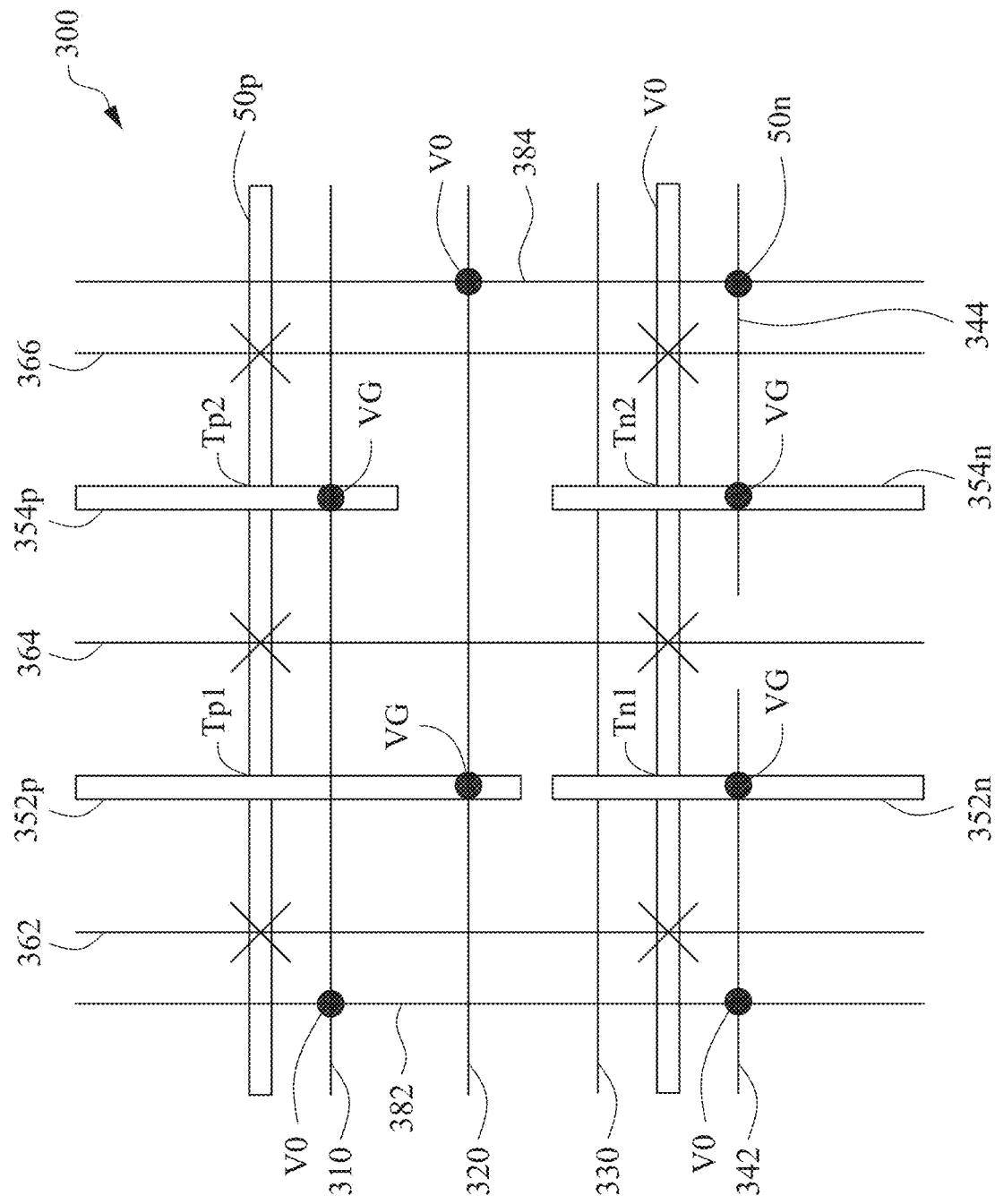
FIG. 3D is a stick diagram of the partial layout diagram in FIG. 3C, in accordance with some embodiments.
Figure 3E:
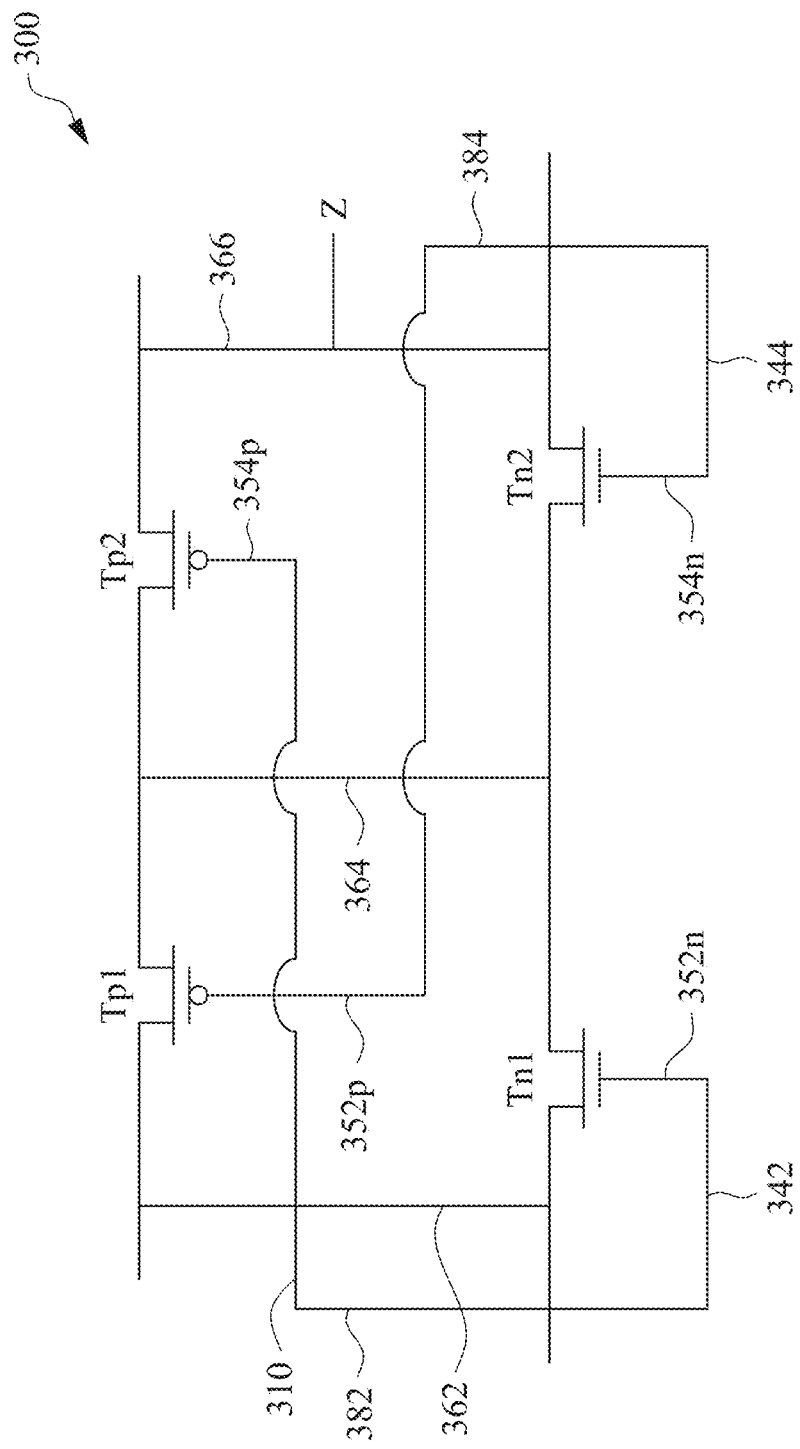
FIG. 3E is an equivalent circuit of the semiconductor cell structure as specified by the stick diagram in FIG. 3C, in accordance with some embodiments.
Figure 3F:
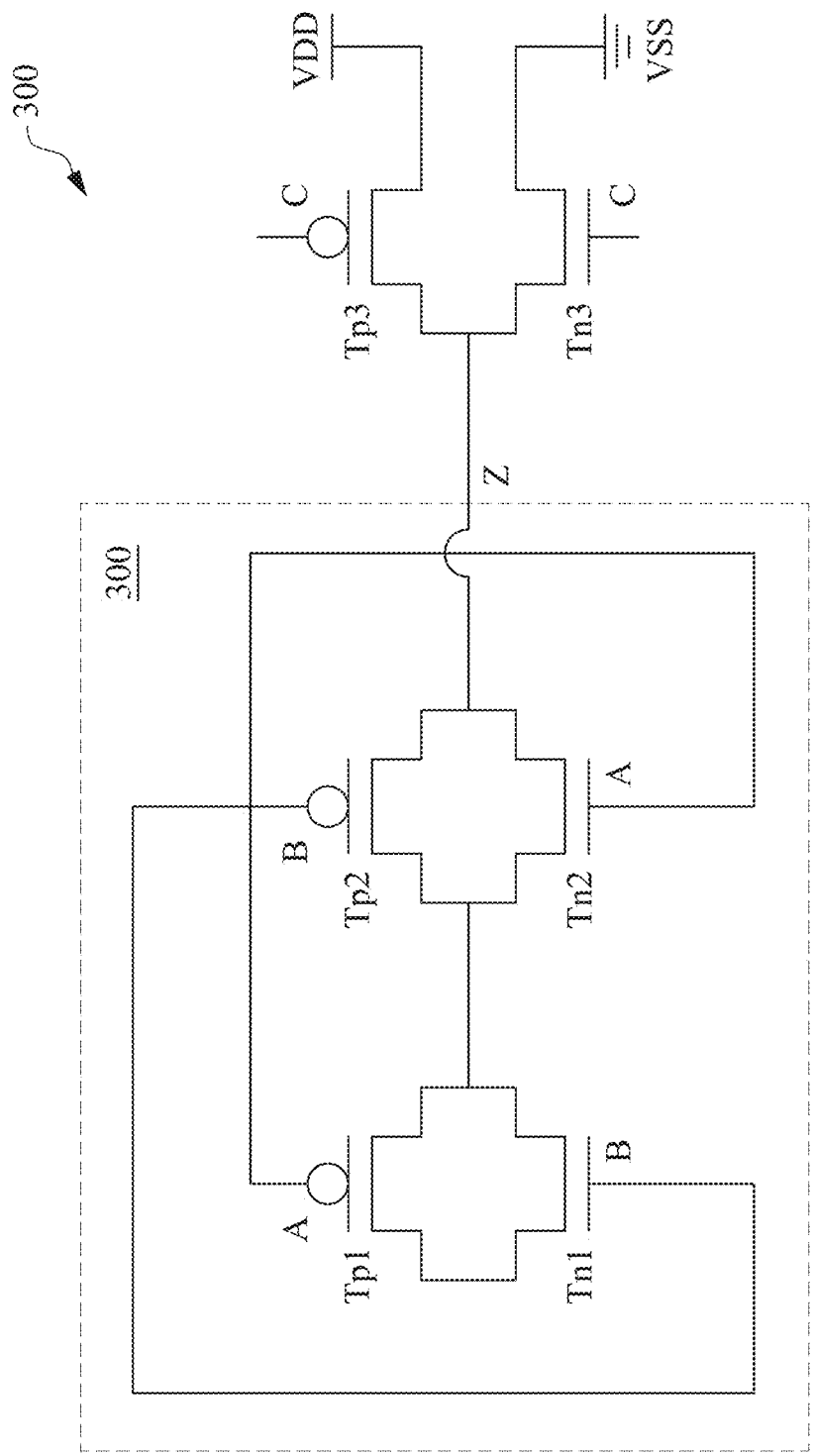
FIG. 3F is a circuit diagram of the semiconductor cell structure of FIG. 3E in connection with additional circuit elements, in accordance with some embodiments.

FIG. 3C is a partial layout diagram of the semiconductor cell structure 300 generated from superimposed partial layout diagrams of FIG. 3A and FIG. 3B, in accordance with some embodiments. FIG. 3D is a stick diagram of the partial layout diagram in FIG. 3C, in accordance with some embodiments. FIG. 3E is an equivalent circuit of the semiconductor cell structure 300 as specified by the stick diagram in FIG. 3C, in accordance with some embodiments. As shown in FIGS. 3C-3E, the conductive segment 362 connects a first source/drain terminal of the transistor Tp1 with a first source/drain terminal of the transistor Tn1. The conductive segment 366 connects a first source/drain terminal of the transistor Tp2 with a first source/drain terminal of the transistor Tn2. The second source/drain terminals of the transistors Tp1 and Tp2 are connected to the second source/drain terminals of the transistors Tn1 and Tn2 through the conductive segment 364. The gate terminal of the transistor Tp1 is connected to the gate terminal of the transistor Tn2 through the gate-strip segment 352p, the horizontal routing track 320, the vertical routing track 384, the horizontal routing track 344, and the gate-strip segment 354n. The gate terminal of the transistor Tp2 is connected to the gate terminal of the transistor Tn1 through the gate-strip segment 354p, the horizontal routing track 310, the vertical routing track 382, the horizontal routing track 342, and the gate-strip segment 352n. A connection terminal Z of the semiconductor cell structure 300 is provided by a conductor connected to the conductive segment 366. As an example of using the semiconductor cell structure 300 as a sub-circuit, FIG. 3F is a circuit diagram of the semiconductor cell structure 300 in connection with additional circuit elements. In FIG. 3F, the connection terminal Z of the semiconductor cell structure 300 is connected to the drain terminal of the p-channel field effect transistor Tp3 and the drain terminal of the n-channel field effect transistor Tn3. The source terminal of the p-channel field effect transistor Tp3 is connected to the power line VDD and the source terminal of the n-channel field effect transistor Tn3 is connected to the power line VSS.

In FIG. 3C, a first distance D1 along the Y-direction between the long edge 41 of the first power rail 40 and the first alignment boundary 51p of the p-type active zone is different from a second distance D2 along the Y-direction between the long edge 61 of the second power rail and the first alignment boundary 51n of the n-type active zone 50n by a predetermined distance. In some embodiments, the predetermined distance is at least 10% of the separation distance D of the power rails, which is |D1-D2|≥0.1D. In some embodiments, the predetermined distance is at least 20% of the separation distance D of the power rails, which is |D1-D2|≥0.2D. In FIGS. 3A-3C, because the p-type active zone is offset from the n-type active zone 50n by the predetermined distance |D1-D2|, a connector VG is available for connecting the gate-strip segment 352p to the routing track 320 while the gate-strip segment 352n is connected to the routing track 342. The cell width of the semiconductor cell structure 300 in the layout in FIGS. 3A-3C is three CPP. In some alterative layout designs of the same circuit 300 as shown in FIG. 3F, the cell width of the alterative layout designs may take four or five CPP. In the alterative layout designs, when the gate-strip segment 352p and the gate-strip segment 352n are vertically aligned, as the cell height becomes smaller, the connector VG cannot be used to connect the gate-strip segment 352p to the routing track 320 if the gate-strip segment 352n is connected to the routing track 342 through another via connector VG.

The availability of the via connectors (VG1, VG2, and VG3) for connecting the routing tracks to the gate-strip segments of a same gate-strip provides some routing flexibility for forming various circuits in the semiconductor cell structures.

Figure 4A:
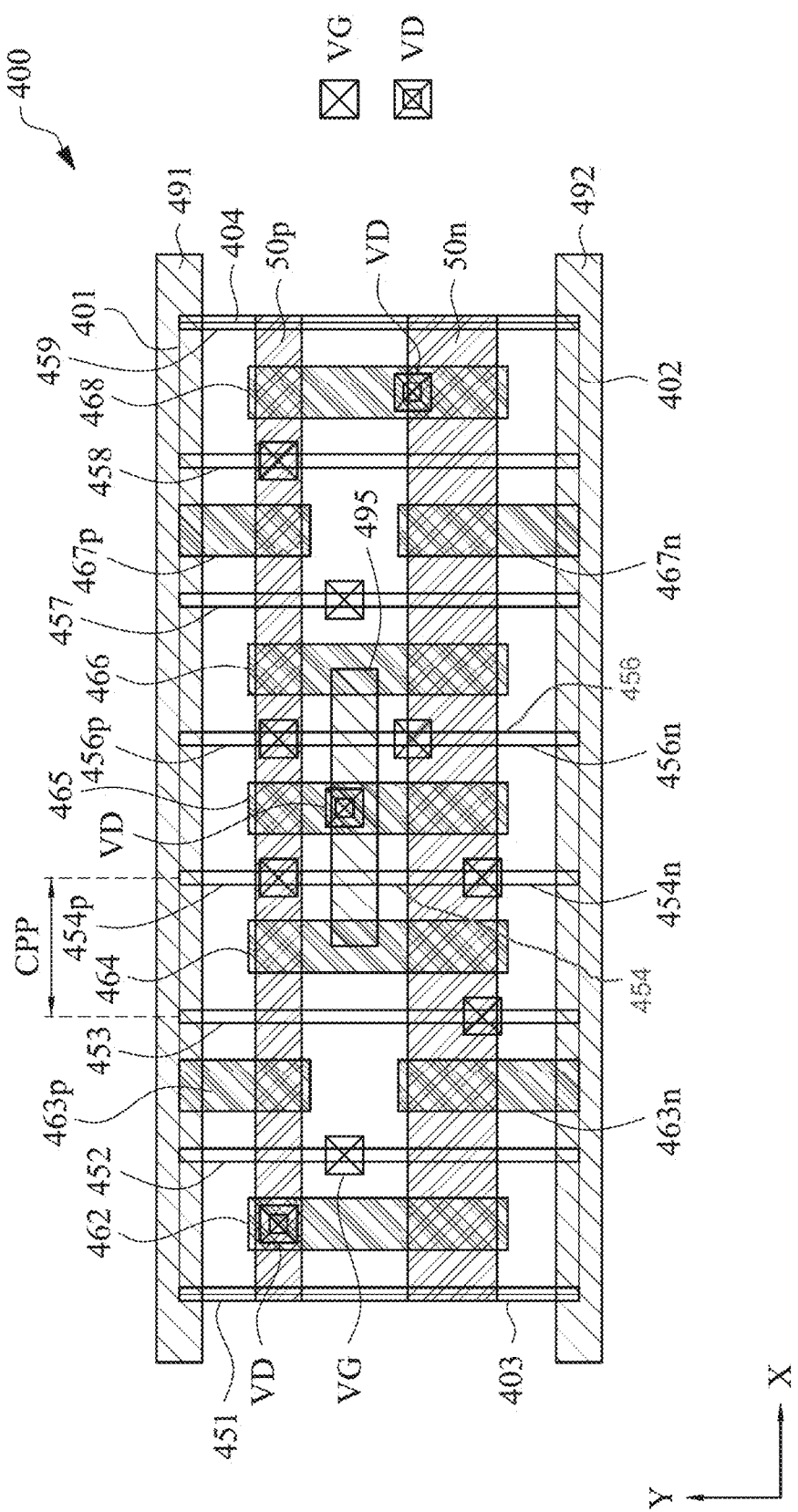
FIGS. 4A-4C are partial layout diagrams of a semiconductor cell structure having twelve transistors, in accordance with some embodiments.
Figure 4B:
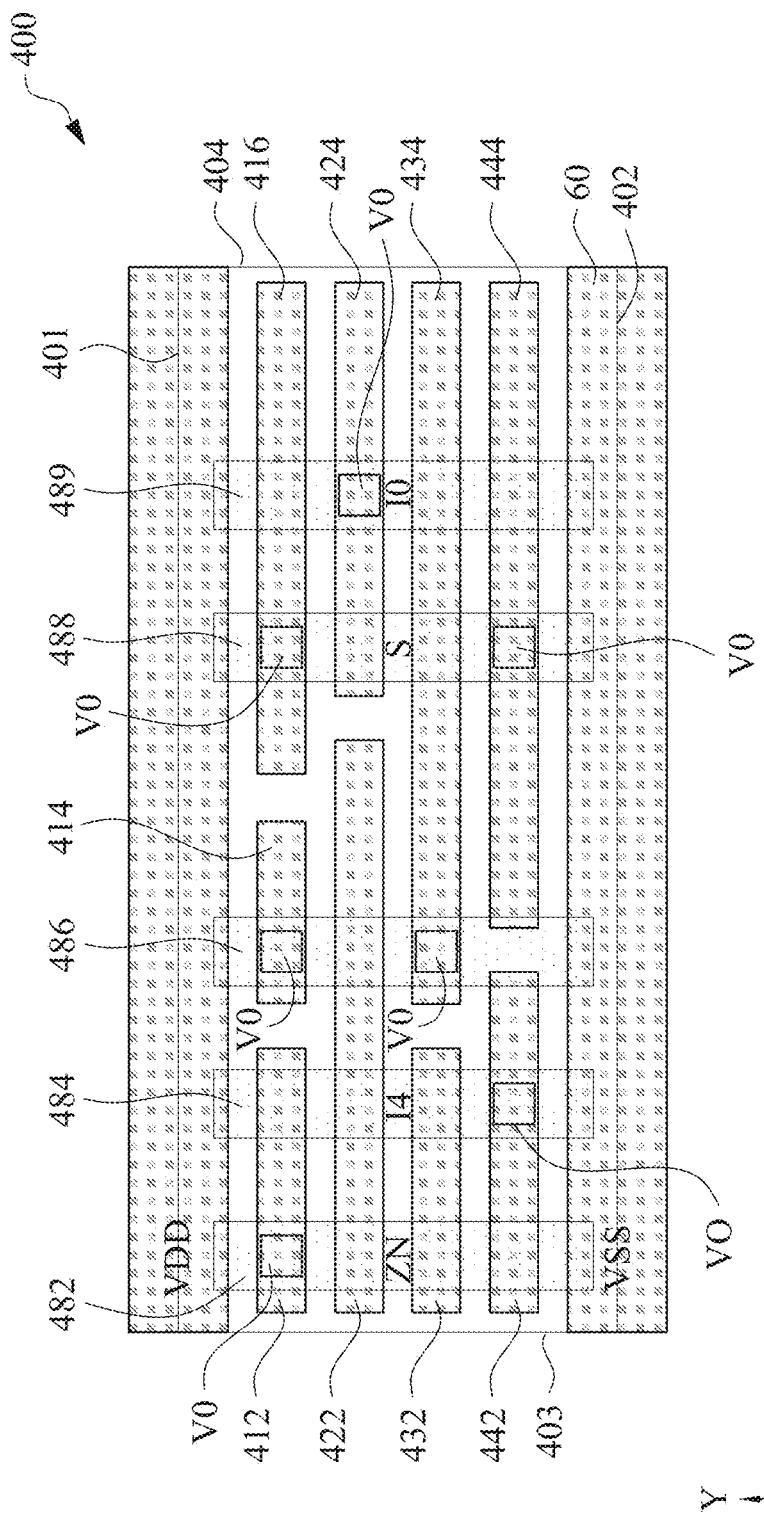
Figure 4C:
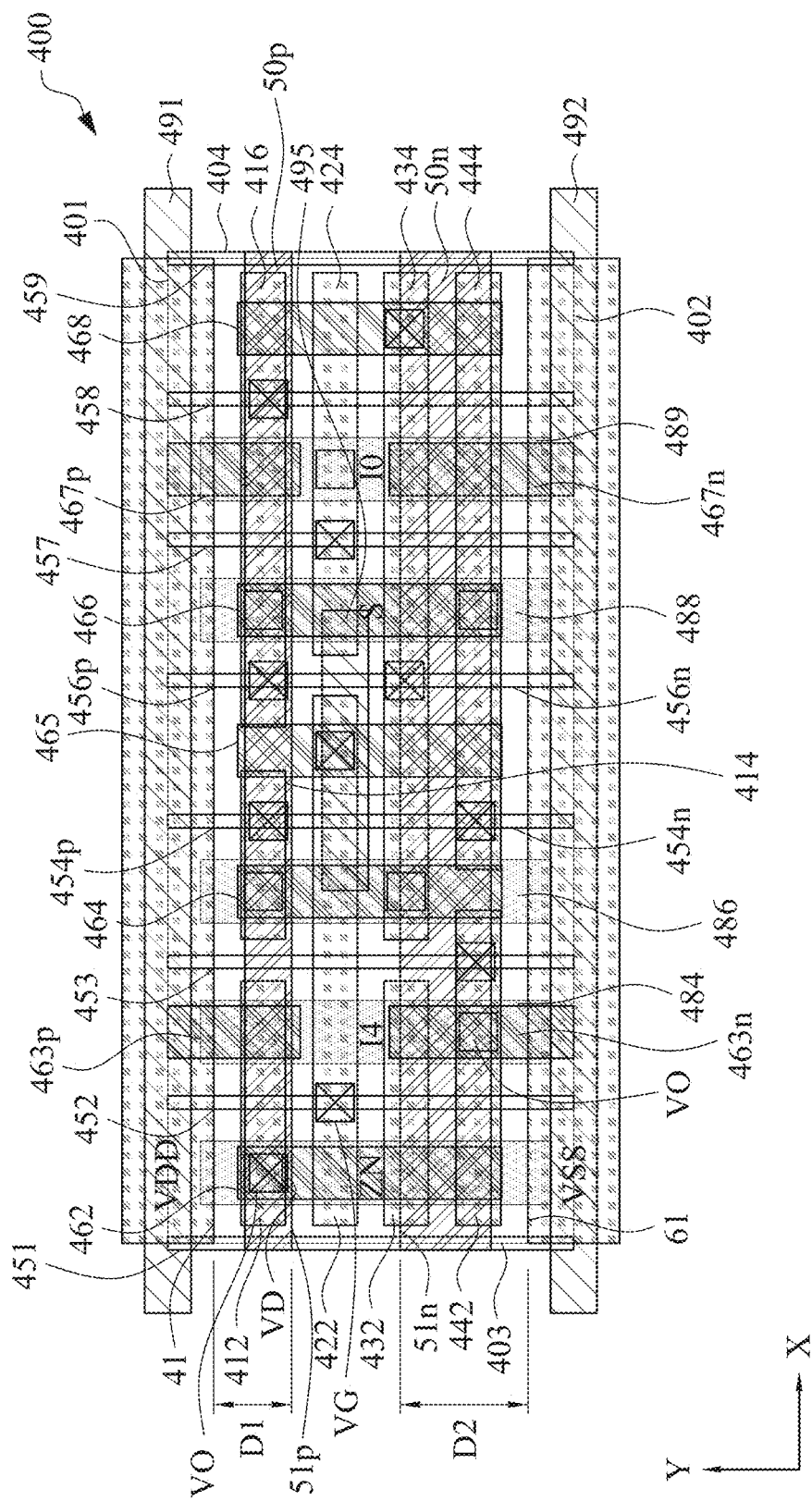

FIGS. 4A-4C are partial layout diagrams of a semiconductor cell structure 400, in accordance with some embodiments. The partial layout diagrams of FIGS. 4A-4C include various layout elements of the semiconductor cell structure 400 within cell boundaries 401, 402, 403, and 404. Specifically, in FIG. 4A, the semiconductor cell structure 400 includes the p-type active zone 50p, the n-type active zone 50n, and poly-cut patterns (491, 492, and 495). The semiconductor cell structure 400 also includes multiple gate-strips (451, 452, 453, 454, 456, 457, 458, and 459) and multiple conductive segments (e.g., 462, 463p, 463n, 464, 465, 466, 467p, 467n, and 468). In some embodiments, the multiple gate-strips are separated by identical pitch distances, and the pitch distance between two adjacent gate-strips is one contacted poly pitch (CPP). The poly-cut patterns 391 and 392 terminate multiple gate-strips (451, 452, 453, 454, 456, 457, 458, and 459) near the horizontal boundaries 401 and 402 of the semiconductor cell structure 400. The poly-cut pattern 495 divides the gate-strip 454 into the gate-strip segments 454p and 454n. The poly-cut pattern 495 also divides the gate-strip 456 into the gate-strip segments 456p and 456n. In some embodiments, the gate-strips 451 and 459 are dummy gate-strips which are not used for forming gates of transistors.

In FIG. 4A, the gate-strip segments 454p and 456p intersect the p-type active zone 50p and correspondingly form the gate of the p-channel field effect transistor T4p and the gate of the p-channel field effect transistor T6p. The gate-strip segments 454n and 456n intersect the n-type active zone 50n and correspondingly form the gate of the n-channel field effect transistor T4n and the gate of the n-channel field effect transistor T6n. The gate-strip 452 intersects the p-type active zone 50p and the n-type active zone 50n, forming correspondingly the gate of the p-channel field effect transistor T2p and the gate of the n-channel field effect transistor T2n. The gate-strip 453 intersects the p-type active zone 50p and the n-type active zone 50n, forming correspondingly the gate of the p-channel field effect transistor T3p and the gate of the n-channel field effect transistor T3n. The gate-strip 457 intersects the p-type active zone 50p and the n-type active zone 50n, forming correspondingly the gate of the p-channel field effect transistor T7p and the gate of the n-channel field effect transistor T7n. The gate-strip 458 intersects the p-type active zone 50p and the n-type active zone 50n, forming correspondingly the gate of the p-channel field effect transistor T8p and the gate of the n-channel field effect transistor T8n.

In FIG. 4A, the conductive segment 463p intersects the p-type active zone 50p while forming the conductive contact with the source/drain terminals of the p-channel field effect transistors T2p and T3p. The conductive segment 463n intersects the n-type active zone 50n while forming the conductive contact with the source/drain terminals of the n-channel field effect transistors T2n and T3n. The conductive segment 467p intersects the p-type active zone 50p while forming the conductive contact with the source/drain terminals of the p-channel field effect transistors T7p and T8p. The conductive segment 467n intersects the n-type active zone 50n while forming the conductive contact with the source/drain terminals of the n-channel field effect transistors T7n and T8n.

In FIG. 4A, the conductive segment 462 intersects the p-type active zone 50p and the n-type active zone 50n, connecting the drain terminal of the transistor T2p with the drain terminal of the transistor T2n. The conductive segment 464 intersects the p-type active zone 50p and the n-type active zone 50n, connecting the source/drain terminals of the transistors T3p and T4p with the source/drain terminals of the transistors T3n and T4n. The conductive segment 465 intersects the p-type active zone 50p and the n-type active zone 50n, connecting the source/drain terminals of the transistors T4p and T6p with the source/drain terminals of the transistors T4n and T6n. The conductive segment 466 intersects the p-type active zone 50p and the n-type active zone 50n, connecting the source/drain terminals of the transistors T6p and T7p with the source/drain terminals of the transistors T6n and T7n. The conductive segment 468 intersects the p-type active zone 50p and the n-type active zone 50n, connecting the drain terminal of the transistor T8p with the drain terminal of the transistor T8n.

In FIG. 4A, the semiconductor cell structure 400 includes four via connectors VG each connecting one of the gate-strip segments 454p, 456p, 454n, and 456n to a horizontal routing track extending in the X-direction. The semiconductor cell structure 400 also includes another four via connectors VG each connecting one of the gate-strips 452, 453, 457, and 458 to a horizontal routing tracks extending in the X-direction. In FIG. 4A, the semiconductor cell structure 400 still includes three via connectors VD each connecting one of the conductive segments 462, 465 and 468 to a horizontal routing track.

FIG. 4B is a partial layout diagram of the routing tracks, power rails, and via connectors in the semiconductor cell structure 400, in accordance with some embodiments. Specifically, the semiconductor cell structure 400 includes multiple horizontal routing tracks (e.g., 412, 414, 416, 422, 424, 432, 434, 442, and 444) extending in the X-direction and vertical routing tracks (e.g., 482, 484, 486, 488, and 489) extending in the Y-direction. In some embodiments, horizontal routing tracks (e.g., 412, 414, 416, 422, 424, 432, 434, 442, and 444) have equal track width along the Y-direction and are separated by identical pitch distances. The semiconductor cell structure 400 also includes power rails 40 and 60 extending in the X-direction. In some embodiments, the horizontal routing tracks are fabricated in a first metal layer (e.g., sometimes labeled as M0 layer) immediately overlying the interlayer dielectric (ILD) that covers the gate-strip segments connecting the gate terminals and the conductive segments connecting the source/drain terminals, while the vertical routing tracks are fabricated in a second metal layer (e.g., sometimes labeled as M1 layer) on the inter-metal dielectric (IMD) between the first metal layer and the second metal layer. In some embodiments, the power rails 40 and 60 are fabricated in the first metal layer (e.g., sometimes labeled as M0 layer). In some alternative embodiments, the power rails 40 and 60 are fabricated as buried power rails located below the first metal layer.

In FIG. 4B, the semiconductor cell structure 400 also includes seven via connectors VO. Two via connectors VO connect the vertical routing track 486 to the horizontal routing tracks 414 and 434, and two via connectors VO connect the vertical routing track 488 to the horizontal routing tracks 416 and 444. One via connector VO connects the vertical routing track 482 to the horizontal routing track 412, one via connector VO connects the vertical routing track 484 to the horizontal routing track 442, and one via connector VO connects the vertical routing track 489 to the horizontal routing track 424.

Figure 4D:
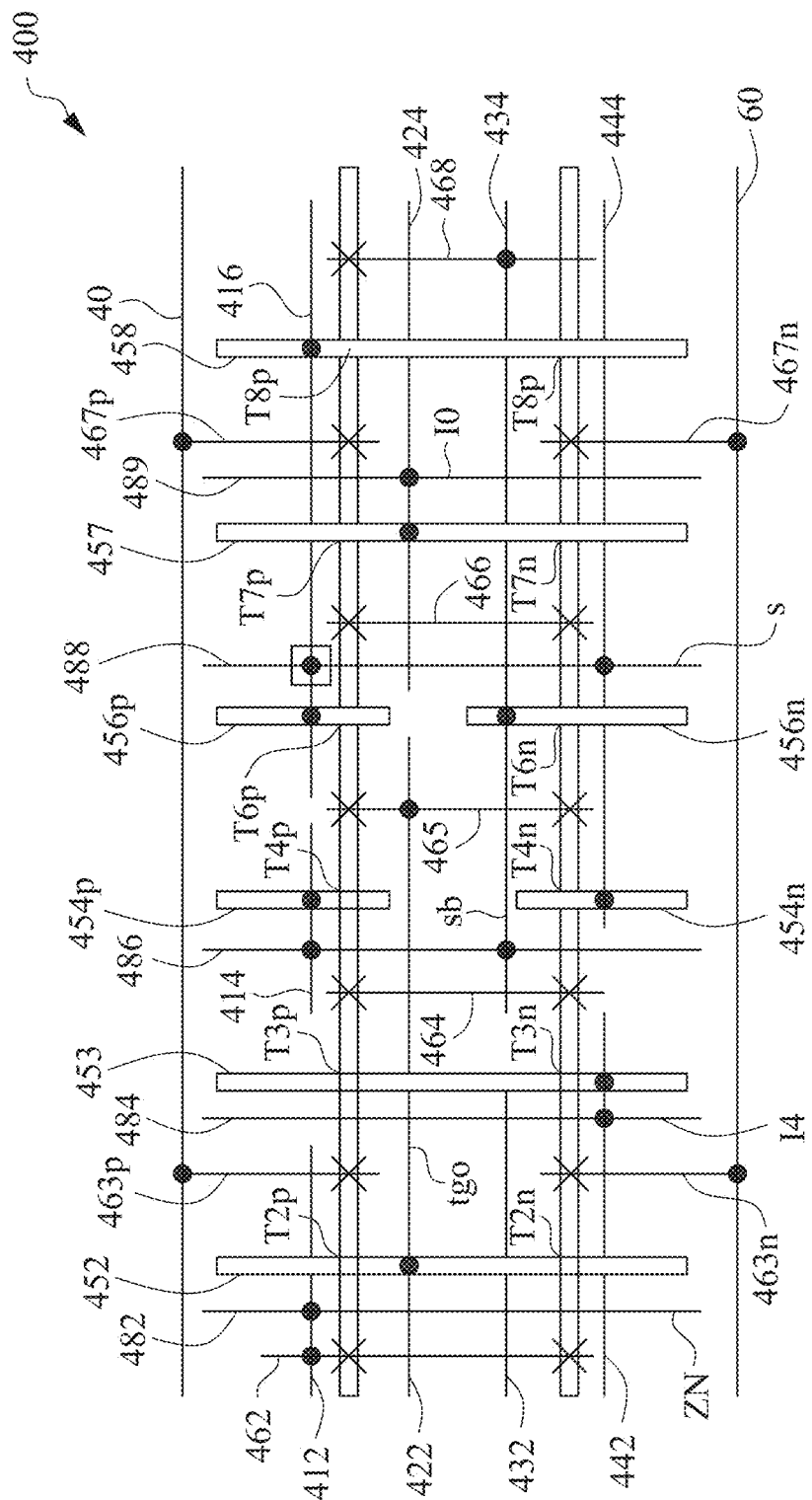
FIG. 4D is a stick diagram of the partial layout diagram in FIG. 4C, in accordance with some embodiments.
Figure 4E:
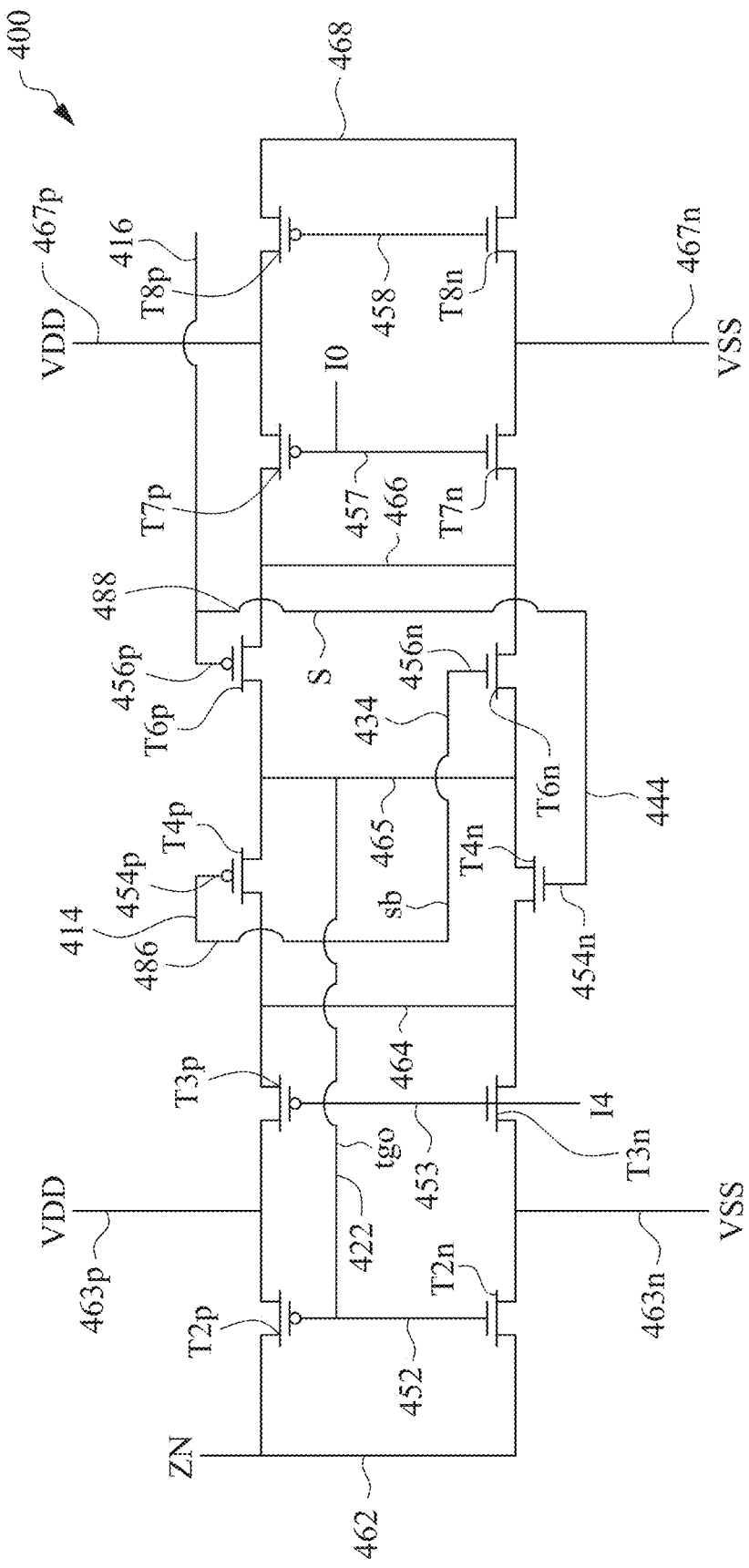
FIG. 4E is a circuit diagram of an equivalent circuit of the semiconductor cell structure as specified by the stick diagram in FIG. 4D, in accordance with some embodiments.

FIG. 4C is a partial layout diagram of the semiconductor cell structure 400 generated from superimposed partial layout diagrams of FIG. 4A and FIG. 4B, in accordance with some embodiments. FIG. 4D is a stick diagram of the partial layout diagram in FIG. 4C, in accordance with some embodiments. FIG. 4E is a circuit diagram of an equivalent circuit of the semiconductor cell structure 400 as specified by the stick diagram in FIG. 4D, in accordance with some embodiments. In FIGS. 4C-4E, the source terminals of the transistors T2p and T3p are connected to the power rail 40 of VDD through the conductive segment 463p, forming the output node "ZN". The source terminals of the transistors T7p and T8p are connected to the power rail 40 of VDD through the conductive segment 467p. The source terminals of the transistors T2n and T3n are connected to the power rail 60 of VSS through the conductive segment 463n. The source terminals of the transistors T7n and T8n are connected to the power rail 60 of VSS through the conductive segment 467n. The drain terminals of the transistor T2p and T2n are connected together through the conductive segment 462. The joint source/drain terminals of the transistors T3p and T4p are connected to the joint source/drain terminals of the transistors T3n and T4n through the conductive segment 464. The joint source/drain terminals of the transistors T4p and T6p are connected to the joint source/drain terminals of the transistors T4n and T6n through the conductive segment 465. The joint source/drain terminals of the transistors T6p and T7p are connected to the joint source/drain terminals of the transistors T6n and T7n through the conductive segment 466. The drain terminals of the transistor T8p and T8n are connected together through the conductive segment 468.

The gate terminals of the transistors T2p and T2n are connected together through the gate-strip 452, and the gate-strip 452 is further connected to the conductive segment 465, forming the connection node "tgo" (FIGS. 4D-4E). The gate terminals of the transistors T3p and T3n are connected together through the gate-strip 453, forming the input node "I4". The gate terminals of the transistors T7p and T7n are connected together through the gate-strip 457, forming the input node "I0". The gate terminals of the transistors T8p and T8n are connected together through the gate-strip 458. The gate terminal of the transistor T4p is connected to the gate terminal of the transistor T6n through the gate-strip segment 454p, the horizontal routing track 414, the vertical routing track 486, the horizontal routing track 434, and the gate-strip segment 456n. The connection between the gate terminal of the transistor T4p and the gate terminal of the transistor T6n forms the connection node "sb" (FIGS. 4D-4E). The gate terminal of the transistor T4n is connected to the gate terminal of the transistor T6n through the gate-strip segment 454n, the horizontal routing track 444, the vertical routing track 488, the horizontal routing track 416, and the gate-strip segment 456p. The connection between the gate terminal of the transistor T4n and the gate terminal of the transistor T6p is a part of the connection node "S", which is further connected to the gate terminals of the transistors T8p and T8n.

In FIGS. 4C-4D, signals at the input node "I0" are transmitted to the vertical routing track 489, the horizontal routing track 424, and the gate-strip 457. Signals at the input node "I4" are transmitted to the vertical routing track 484, the horizontal routing track 442, and the gate-strip 453. Signals at output node "ZN" are transmitted to conductive segment 462, the horizontal routing track 412, and the vertical routing track 482.

Figure 4F:
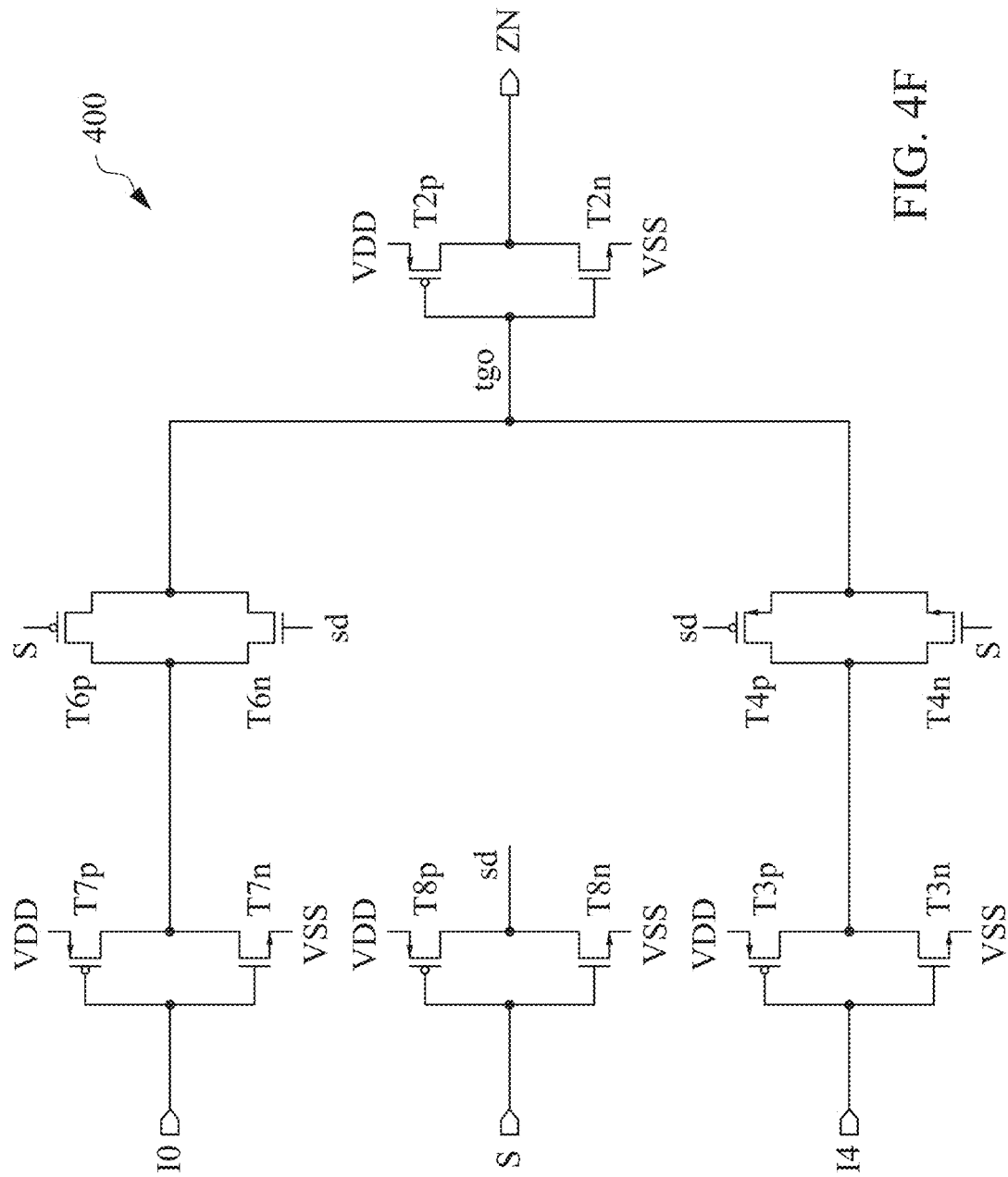
FIG. 4F is a circuit diagram, with different format, of the circuit in FIG. 4E, in accordance with some embodiments.

FIG. 4F is a circuit diagram, drawing with different format, of the circuit in FIG. 4E, in accordance with some embodiments. In FIG. 4F, the transistors T7p and T7n form an inverter which receives a first input "I0" at the gate terminals of the transistors T7p and T7n. The transistors T3p and T3n form an inverter which receives a second input "I4" at the gate terminals of the transistors T3p and T3n. The transistors T2p and T2n form an inverter which generates an output "ZN". The gate terminals of the transistors T2p and T2n receives an input at the connection node "tgo" from a transmission gate circuit formed by transistors T4p, T4n, T6p, T6n, T8p, and T8n. The transistors T6p and T6n form a linear switch between the connection node "tgo" and the output of the inverter for receiving the first input "I0". The transistors T4p and T4n form a linear switch between the connection node "tgo" and the output of the inverter for receiving the second input "I4". The transistors T8p and T8n form an inverter for providing the control signal at the connection node "sb". The control signal "S" is simultaneously provided to the gate of the transistors T6p and T4n, while the inverted control signal "sb" at the output of the inverter formed by the transistors T8p and T8n is provided to the gate of the transistors T6n and T4p. Either the signal at the first input "I0 or the signal at the second input "I4" is selectively outputted to the output "ZN" by the control signal "S".

In FIG. 4C, a first distance D1 along the Y-direction between the long edge 41 of the first power rail 40 and the first alignment boundary 51p of the p-type active zone is different from a second distance D2 along the Y-direction between the long edge 61 of the second power rail and the first alignment boundary 51n of the n-type active zone 50n by a predetermined distance. In some embodiments, the predetermined distance is at least 10% of the separation distance D of the power rails, which is |D1-D2|≥0.1D. In some embodiments, the predetermined distance is at least 20% of the separation distance D of the power rails, which is |D1-D2|≥0.2D. In FIGS. 4A-4C, because the p-type active zone is offset from the n-type active zone 50n by the predetermined distance |D1-D2|, a connector VG is available for connecting the gate-strip segment 456n to the routing track 434 while the gate-strip segment 456p is connected to the routing track 416. The cell width of the semiconductor cell structure 400 in the layout in FIGS. 4A-4C is seven CPP. In some alterative layout designs of the same circuit 400 as shown in FIG. 3F, the cell width of the alterative layout designs may take nine or eleven CPP. In the alterative layout designs, when the gate-strip segment 456n and the gate-strip segment 456p are vertically aligned, as the cell height becomes smaller, a connector VG cannot be used to connect the gate-strip segment 456n to the routing track 434 if the gate-strip segment 456p is connected to the routing track 416 through another via connector VG.

Figure 5:
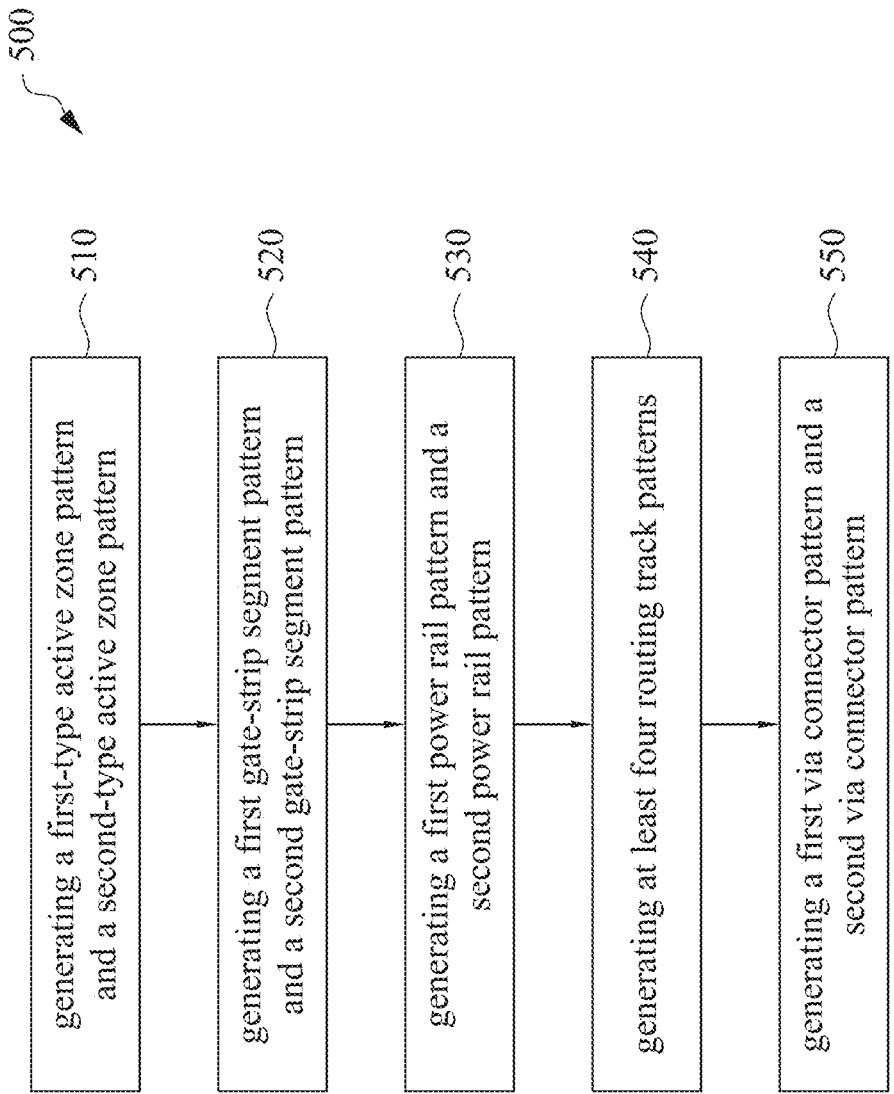
FIG. 5 is a flowchart of a method of generating a layout design of an integrated circuit, in accordance with some embodiments.

FIG. 5 is a flowchart of a method 500 of generating a layout design of an integrated circuit in accordance with some embodiments. It is understood that additional operations may be performed before, during, and/or after the method 500 depicted in FIG. 5, and that some other processes may only be briefly described herein. In some embodiments, the method 500 is usable to generate one or more layout designs, such as the layout designs in FIG. 1A, FIG. 2A, FIGS. 3A-3C, or FIGS. 4A-4C. In some embodiments, the method 500 is usable to form integrated circuits having similar structural relationships as one or more of the semiconductor structures formed based on the layout designs in FIG. 1A, FIG. 2A, FIGS. 3A-3C, or FIGS. 4A-4C. In some embodiments, the method 500 is usable to form integrated circuits having similar structural relationships as one or more of the semiconductor structures in FIG. 1B or 2B. In some embodiments, method 500 is performed by a processing device (e.g., processor 602 in FIG. 6) configured to execute instructions for generating one or more layout designs, such as the layout designs in FIG. 1A, FIG. 2A, FIGS. 3A-3C, or FIGS. 4A-4C.

In operation 510 of method 500, a first-type active zone pattern and a second-type active zone pattern are generated. In the example layout designs of FIG. 1A, FIG. 2A, FIGS. 3A-3C, and FIGS. 4A-4C, each of the p-type active zone 50p and the n-type active zone 50n is specified by a correspondingly p-type active zone pattern or a correspondingly n-type active zone pattern.

In operation 520 of method 500, a first gate-strip segment pattern and a second gate-strip segment pattern are generated. In the example layout designs of FIG. 1A and FIG. 2A, each of the first gate-strip segment 155p and the second gate-strip segment 155n is specified by a correspondingly first gate-strip segment pattern or a correspondingly second gate-strip segment pattern. In some embodiments, the first gate-strip segment pattern and the second gate-strip segment pattern are formed from a poly pattern intersected by a poly-cut pattern. In some embodiments, the poly pattern and the poly-cut pattern are more than logical representation of the gate-strip segment patterns, and additionally, the poly pattern and the poly-cut pattern also represent specific physical elements formed during device fabrications. For example, in some embodiments, the poly pattern represents a gate-strip (e.g., 155) formed during fabrication, the poly-cut pattern represents an area subjected to an etching process, and the intersection between the poly pattern and the poly-cut pattern represents the portion of the gate-strip that is removed by the etching process. After the etching process, the gate-strip (e.g., 155) represented by the poly pattern is divided into the first gate-strip segment (e.g., 155p) and the second gate-strip segment (e.g., 155n).

Other example layout designs which have a first gate-strip segment pattern and a second gate-strip segment pattern are provided in the layout designs of FIGS. 3A-3C and FIGS. 4A-4C. In the example layout designs of FIG. 3A and FIG. 3C, each of the first gate-strip segment (e.g., 352p or 354p) and the second gate-strip segment (e.g., 352n or 354n) is specified by a correspondingly first gate-strip segment pattern or a correspondingly second gate-strip segment pattern, where the gate-strip segment patterns are represented by the corresponding poly pattern (e.g., the poly pattern for the gate-strip 352 or 354) and the poly-cut pattern 395. In the example layout designs of FIG. 4A and FIG. 4C, each of the first gate-strip segment (e.g., 454p or 456p) and the second gate-strip segment (e.g., 454n or 456n) is specified by a correspondingly first gate-strip segment pattern or a correspondingly second gate-strip segment pattern, where the gate-strip segment patterns are represented by the corresponding poly pattern and the poly-cut pattern 495.

In operation 530 of method 500, a first power rail pattern and a second power rail pattern are generated. In the example layout designs of FIG. 1A, FIG. 2A, FIGS. 3A-3C, and FIGS. 4A-4C, the first power rail 40 and the second power rail 60 are correspondingly specified by a first power rail pattern and a second power rail pattern.

In operations 510 and 530, a first distance along the second direction between the long edge of the first power rail pattern and the first alignment boundary of the first-type active zone pattern is different from a second distance along the second direction between the long edge of the second power rail pattern and the first alignment boundary of the second-type active zone pattern by a predetermined distance. For example, in the layout designs of FIGS. 1B-1C and FIGS. 2B-2C, A first distance D1 along the Y-direction between the long edge 41 of the first power rail 40 and the first alignment boundary 51p of the p-type active zone is different from a second distance D2 along the Y-direction between the long edge 61 of the second power rail and the first alignment boundary 51n of the n-type active zone 50n by a predetermined distance. In some embodiments, the predetermined distance is at least 10% of the separation distance D of the power rails, which is D1-D2≥0.1D. In some embodiments, the predetermined distance is at least 20% of the separation distance D of the power rails, which is D1-D2≥0.2D.

In operation 540 of method 500, at least four routing track patterns are generated. In the example layout designs of FIGS. 1B-1C and FIGS. 2B-2C, each of the four routing tracks 110, 120, 130, and 140 is specified by a corresponding routing track pattern. In the example layout designs of FIGS. 3B-3C, each of the four routing tracks 310, 320, 330, and 342 (or 344) is specified by a corresponding routing track pattern. In the example layout designs of FIGS. 4B-4C, each of the four routing tracks 416, 422 (or 424), 434, and 444 is specified by a corresponding routing track pattern.

In operation 550 of method 500, a first via connector pattern and a second via connector pattern are generated. In the example layout designs of FIGS. 1B-1C and FIGS. 2B-2C, each of the via connector VG1 and the via connector VG2 is specified by a corresponding via connector pattern. In some embodiments, a third via connector pattern is generated. In the example layout designs of FIGS. 1B-1C and FIGS. 2B-2C, the via connector VG3 is also specified by a corresponding via connector pattern.

Figure 6:
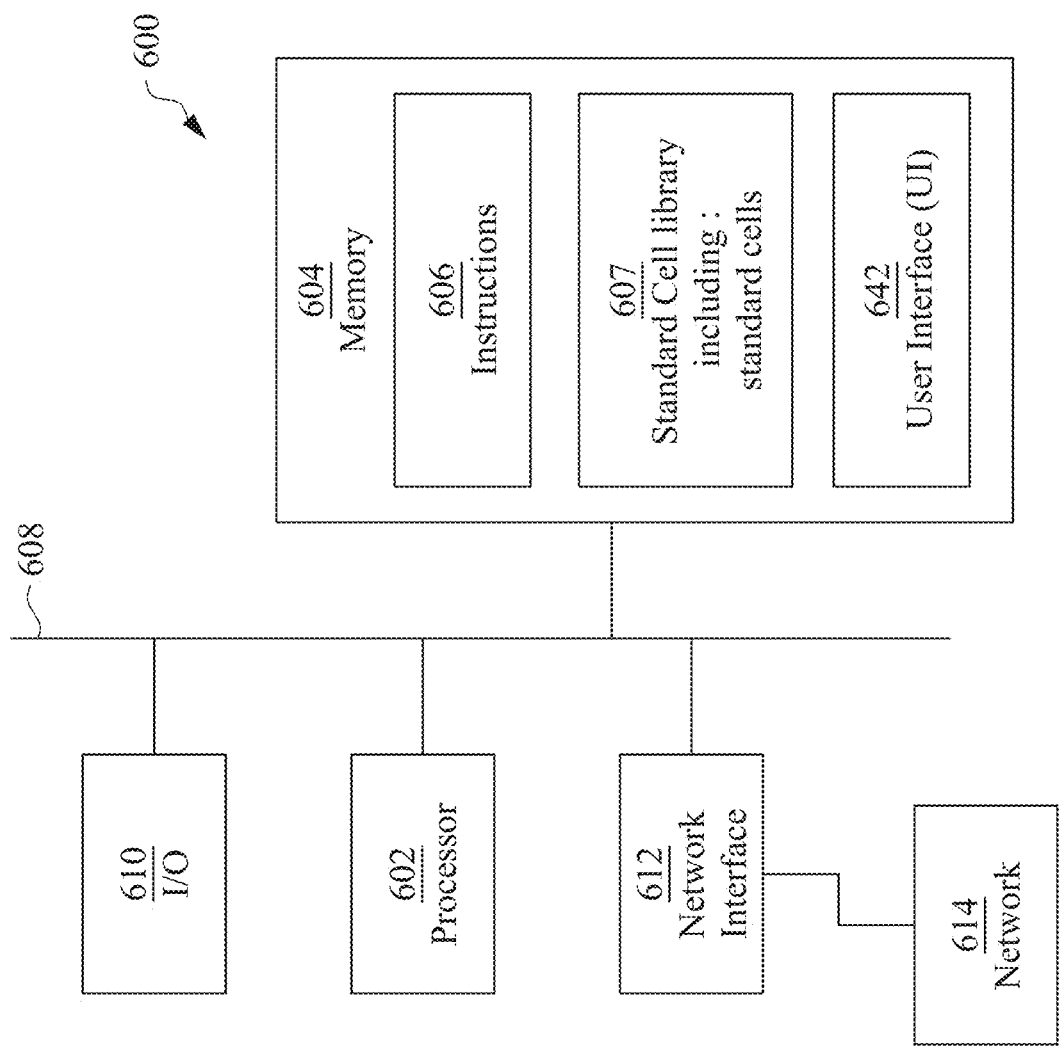
FIG. 6 is a block diagram of an electronic design automation (EDA) system in accordance with some embodiments.

FIG. 6 is a block diagram of an electronic design automation (EDA) system 600 in accordance with some embodiments.

In some embodiments, EDA system 600 includes an APR system. Methods described herein of designing layout diagrams represent wire routing arrangements, in accordance with one or more embodiments, are implementable, for example, using EDA system 600, in accordance with some embodiments.

In some embodiments, EDA system 600 is a general purpose computing device including a hardware processor 602 and a non-transitory, computer-readable storage medium 604. Storage medium 604, amongst other things, is encoded with, i.e., stores, computer program code 606, i.e., a set of executable instructions. Execution of computer program code 606 by hardware processor 602 represents (at least in part) an EDA tool which implements a portion or all of the methods described herein in accordance with one or more embodiments (hereinafter, the noted processes and/or methods).

Processor 602 is electrically coupled to computer-readable storage medium 604 via a bus 608. Processor 602 is also electrically coupled to an I/O interface 610 by bus 608. A network interface 612 is also electrically connected to processor 602 via bus 608. Network interface 612 is connected to a network 614, so that processor 602 and computer-readable storage medium 604 are capable of connecting to external elements via network 614. Processor 602 is configured to execute computer program code 606 encoded in computer-readable storage medium 604 in order to cause system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program code 606 configured to cause system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods. In one or more embodiments, storage medium 604 stores library 607 of standard cells including such standard cells as disclosed herein.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 600.

System 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a UI through I/O interface 610. The information is stored in computer-readable medium 604 as user interface (UI) 642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
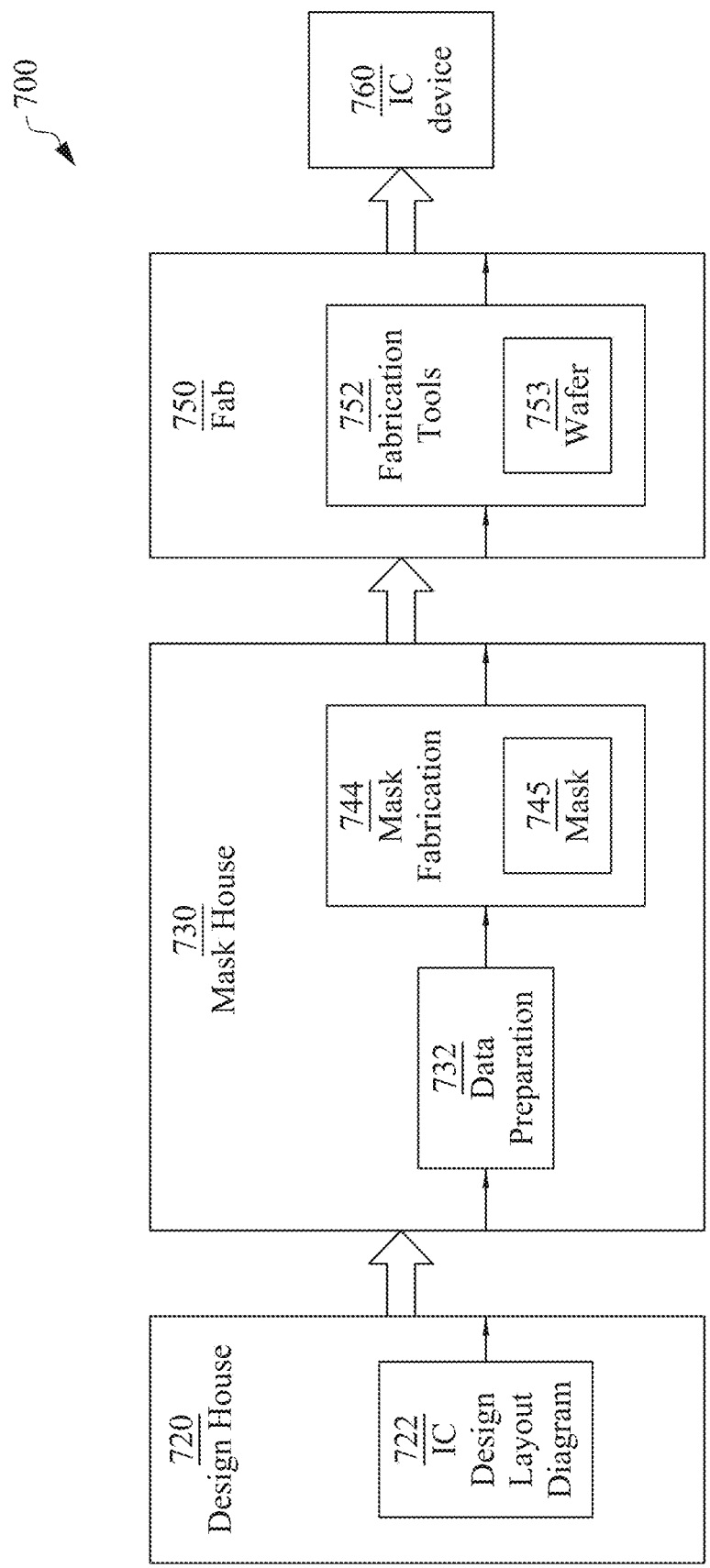
FIG. 7 is a block diagram of an integrated circuit (IC) manufacturing system, and an IC manufacturing flow associated therewith, in accordance with some embodiments.

FIG. 7 is a block diagram of an integrated circuit (IC) manufacturing system 700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 700.

In FIG. 7, IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout diagram 722. IC design layout diagram 722 includes various geometrical patterns designed for an IC device 760. The geometrical patterns correspond to patterns of metal, oxide, or semiconductor layers that make up the various components of IC device 760 to be fabricated. The various layers combine to form various IC features. For example, a portion of IC design layout diagram 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout diagram 722. The design procedure includes one or more of logic design, physical design or place and route. IC design layout diagram 722 is presented in one or more data files having information of the geometrical patterns. For example, IC design layout diagram 722 can be expressed in a GDSII file format or DFII file format.

Mask house 730 includes data preparation 732 and mask fabrication 744. Mask house 730 uses IC design layout diagram 722 to manufacture one or more masks 745 to be used for fabricating the various layers of IC device 760 according to IC design layout diagram 722. Mask house 730 performs mask data preparation 732, where IC design layout diagram 722 is translated into a representative data file ("RDF"). Mask data preparation 732 provides the RDF to mask fabrication 744. Mask fabrication 744 includes a mask writer. A mask writer converts the RDF to an image on a substrate, such as a mask (reticle) 745 or a semiconductor wafer 753. The design layout diagram 722 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout diagram 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks the IC design layout diagram 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 722 to compensate for limitations during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout diagram 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 722.

It should be understood that the above description of mask data preparation 732 has been simplified for the purposes of clarity. In some embodiments, data preparation 732 includes additional features such as a logic operation (LOP) to modify the IC design layout diagram 722 according to manufacturing rules. Additionally, the processes applied to IC design layout diagram 722 during data preparation 732 may be executed in a variety of different orders.

After mask data preparation 732 and during mask fabrication 744, a mask 745 or a group of masks 745 are fabricated based on the modified IC design layout diagram 722. In some embodiments, mask fabrication 744 includes performing one or more lithographic exposures based on IC design layout diagram 722. In some embodiments, an electron-beam (e-beam) or a mechanism of multiple e-beams is used to form a pattern on a mask (photomask or reticle) 745 based on the modified IC design layout diagram 722. Mask 745 can be formed in various technologies. In some embodiments, mask 745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 745 includes a transparent substrate (e.g., fused quartz) and an opaque material (e.g., chromium) coated in the opaque regions of the binary mask. In another example, mask 745 is formed using a phase shift technology. In a phase shift mask (PSM) version of mask 745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

IC fab 750 is an IC fabrication business that includes one or more manufacturing facilities for the fabrication of a variety of different IC products. In some embodiments, IC Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 includes fabrication tools 752 configured to execute various manufacturing operations on semiconductor wafer 753 such that IC device 760 is fabricated in accordance with the mask(s), e.g., mask 745. In various embodiments, fabrication tools 752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 750 uses mask(s) 745 fabricated by mask house 730 to fabricate IC device 760. Thus, IC fab 750 at least indirectly uses IC design layout diagram 722 to fabricate IC device 760. In some embodiments, semiconductor wafer 753 is fabricated by IC fab 750 using mask(s) 745 to form IC device 760. In some embodiments, the IC fabrication includes performing one or more lithographic exposures based at least indirectly on IC design layout diagram 722. Semiconductor wafer 753 includes a silicon substrate or other proper substrate having material layers formed thereon. Semiconductor wafer 753 further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an integrated circuit. The integrated circuit includes first-type transistors and second-type transistors. The first-type transistors have channel regions, source regions, and drain regions aligned within a first-type active zone which has a first alignment boundary extending in a first direction. The second-type transistors have channel regions, source regions, and drain regions aligned within a second-type active zone which has a first alignment boundary extending in the first direction and adjacent to the first alignment boundary of the first-type active zone. The integrated circuit also includes a first power rail and a second power rail. The first power rail extends in the first direction which is adjacent to the first-type active zone and has a long edge separated from the first alignment boundary of the first-type active zone by a first distance along a second direction perpendicular to the first direction. The second power rail extends in the first direction which is adjacent to the second-type active zone and has a long edge separated from the first alignment boundary of the second-type active zone by a second distance along the second direction. The first distance is different from the second distance by a predetermined distance which is at least 10% of a third distance along the second direction between the long edge of the first power rail and the long edge of the second power rail.

Another aspect of this description relates to an integrated circuit. The integrated circuit includes a first-type active zone and a second-type active zone. The first-type active zone has a first alignment boundary which extends in a first direction which is perpendicular to a second direction. The second-type active zone has a first alignment boundary which extends in the first direction and is adjacent to the first alignment boundary of the first-type active zone. The integrated circuit also includes a first gate-strip segment and a second gate-strip segment. The first gate-strip segment intersects the first-type active zone over a channel region of a first-type transistor. The second gate-strip segment intersects the second-type active zone over a channel region of a second-type transistor. The integrated circuit further includes at least four routing tracks extending in the first direction. The at least four routing tracks includes at least two inner routing tracks adjacent each other and positioned between a first outer routing track and a second outer routing track. Each of the first outer routing track and the second outer routing track has an inner side adjacent the at least two inner routing tracks. In the integrated circuit, a first distance along the second direction between the inner side of the first outer routing track and the first alignment boundary of the first-type active zone is different from a second distance along the second direction between the inner side of the second outer routing track and the first alignment boundary of the second-type active zone by a predetermined distance.

Still another aspect of this description relates to a method of forming an integrated circuit. The method comprising generating by a processor a layout design of the integrated circuit. The generating the layout design includes generating a first-type active zone pattern having a first alignment boundary which extends in a first direction, and generating a second-type active zone pattern having a first alignment boundary which extends in the first direction and is adjacent to the first alignment boundary of the first-type active zone pattern. The generating the layout design also includes generating a first power rail pattern specifying a first power rail extending in the first direction which has a long edge adjacent to the first-type active zone pattern and separated from the first alignment boundary of the first-type active zone pattern by a first distance along a second direction perpendicular to the first direction, and generating a second power rail pattern specifying a second power rail extending in the first direction which has a long edge adjacent to the second-type active zone pattern and separated from the first alignment boundary of the second-type active zone pattern by a second distance along the second direction. The first distance is different from the second distance by a predetermined distance which is at least 10% of a third distance between the long edge of the first power rail pattern and the long edge of the second power rail pattern.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   first-type transistors having channel regions, source regions, and drain regions aligned within a first-type active zone which has a first alignment boundary extending in a first direction;
   second-type transistors having channel regions, source regions, and drain regions aligned within a second-type active zone which has a first alignment boundary extending in the first direction and adjacent to the first alignment boundary of the first-type active zone;
   a first power rail extending in the first direction which is adjacent to the first-type active zone and has a long edge separated from the first alignment boundary of the first-type active zone by a first distance along a second direction perpendicular to the first direction;
   a second power rail extending in the first direction which is adjacent to the second-type active zone and has a long edge separated from the first alignment boundary of the second-type active zone by a second distance along the second direction; and
   wherein the first distance is different from the second distance by a predetermined distance which is at least 10% of a third distance along the second direction between the long edge of the first power rail and the long edge of the second power rail.

2. The integrated circuit of claim 1, further comprising:
   a plurality of routing tracks, extending in the first direction, equally spaced between the first power rail and the second power rail.

3. The integrated circuit of claim 1, further comprising:
   a gate-strip extending in the second direction and separated into a first gate-strip segment and a second gate-strip segment, the first gate-strip segment intersecting the first-type active zone over a channel region of one of the first-type transistors, and the second gate-strip segment intersecting the second-type active zone over a channel region of one of the second-type transistors;
   at least four routing tracks extending in the first direction between the first power rail and the second power rail, the four routing tracks including two inner routing tracks adjacent each other and positioned between a first outer routing track and a second outer routing track;
   a first via connector connecting one of the first gate-strip segment and the second gate-strip segment to one of the two inner routing tracks; and
   a second via connector connecting a first one of the first gate-strip segment and the second gate-strip segment to the first outer routing track.

4. The integrated circuit of claim 3, further comprising:
   a third via connector connecting a second one of the first gate-strip segment and the second gate-strip segment to the second outer routing track.

5. The integrated circuit of claim 3, wherein each one of the first-type transistors and the second-type transistors is either a nanosheet transistor or a nanowire transistor.

6. The integrated circuit of claim 1, wherein the predetermined distance is at least 20% of a third distance between the long edge of the first power rail and the long edge of the second power rail.

7. The integrated circuit of claim 1, wherein a first separation along the second direction from the long edge of the first power rail to a second alignment boundary of the first-type active zone is identical to a second separation along the second direction from the long edge of the second power rail to a second alignment boundary of the second-type active zone, and wherein each of the first-type active zone and the second-type active zone is between the first alignment boundary thereof and the second alignment boundary thereof.

8. The integrated circuit of claim 3, comprising:
   three via connectors aligned along the second direction between the first power rail and the second power rail, wherein each of the three via connectors is directly connected to one of the at least four routing tracks.

9. An integrated circuit comprising:
a first-type active zone having a first alignment boundary which extends in a first direction which is perpendicular to a second direction;
a second-type active zone having a first alignment boundary which extends in the first direction and is adjacent to the first alignment boundary of the first-type active zone;
a first gate-strip segment intersecting the first-type active zone over a channel region of a first-type transistor;
a second gate-strip segment intersecting the second-type active zone over a channel region of a second-type transistor;
at least four routing tracks, extending in the first direction, the at least four routing tracks including at least two inner routing tracks adjacent each other and positioned between a first outer routing track and a second outer routing track, each of the first outer routing track and the second outer routing track having an inner side adjacent the at least two inner routing tracks; and
wherein a first distance along the second direction between the inner side of the first outer routing track and the first alignment boundary of the first-type active zone is different from a second distance along the second direction between the inner side of the second outer routing track and the first alignment boundary of the second-type active zone by a predetermined distance.

10. The integrated circuit of claim 9, further comprising:
a first via connector connecting one of the first gate-strip segment and the second gate-strip segment to one of the at least two inner routing tracks; and
a second via connector connecting the first gate-strip segment to the first outer routing track.

11. The integrated circuit of claim 10, further comprising:
a third via connector connecting the second gate-strip segment to the second outer routing track.

12. The integrated circuit of claim 10, wherein each one of the first-type transistors and the second-type transistors is either a nanosheet transistor or a nanowire transistor.

13. The integrated circuit of claim 9, wherein the predetermined distance is at least one tenth (10%) of a distance between the inner side of the first outer routing track and the inner side of the second outer routing track along the second direction.

14. The integrated circuit of claim 9, wherein the predetermined distance is at least one fifth (20%) of a distance between the inner side of the first outer routing track and the inner side of the second outer routing track along the second direction.

15. A method of forming an integrated circuit, the method comprising generating, by a processor, a layout design of the integrated circuit, wherein generating the layout design comprises:
generating a first-type active zone pattern having a first alignment boundary which extends in a first direction;
generating a second-type active zone pattern having a first alignment boundary which extends in the first direction—and is adjacent to the first alignment boundary of the first-type active zone pattern;
generating a first power rail pattern specifying a first power rail extending in the first direction which has a long edge adjacent to the first-type active zone pattern and separated from the first alignment boundary of the first-type active zone pattern by a first distance along a second direction perpendicular to the first direction;
generating a second power rail pattern specifying a second power rail extending in the first direction which has a long edge adjacent to the second-type active zone pattern and separated from the first alignment boundary of the second-type active zone pattern by a second distance along the second direction; and
wherein the first distance is different from the second distance by a predetermined distance which is at least 10% of a third distance between the long edge of the first power rail pattern and the long edge of the second power rail pattern.

16. The method of claim 15, further comprising:
generating a plurality of routing track patterns, extending in the first direction, equally spaced between the first power rail pattern and the second power rail pattern.

17. The method of claim 15, further comprising:
generating a first gate-strip segment pattern and a second gate-strip segment pattern each extending in the second direction, the first gate-strip segment pattern intersecting the first-type active zone pattern, and the second gate-strip segment pattern intersecting the second-type active zone pattern;
generating at least four routing track patterns extending in the first direction between the first power rail and the second power rail, the at least four routing track patterns including at least two inner routing track patterns adjacent each other and positioned between a first outer routing track pattern and a second outer routing track pattern;
generating a first via connector pattern at an intersection between a first one of the at least two inner routing track patterns and a first one of the first gate-strip segment pattern and the second gate-strip segment pattern; and
generating a second via connector pattern at an intersection between the first outer routing track pattern and a first one of the first gate-strip segment pattern and the second gate-strip segment pattern.

18. The method of claim 17, further comprising:
generating a third via connector pattern at an intersection between the second outer routing track pattern and a second one of the first gate-strip segment pattern and the second gate-strip segment pattern.

19. The method of claim 15, wherein the predetermined distance is at least 20% of a third distance between the long edge of the first power rail pattern and the long edge of the second power rail pattern.

20. The method of claim 15, wherein a first separation along the second direction from the long edge of the first power rail pattern to a second alignment boundary of the first-type active zone pattern is identical to a second separation along the second direction from the long edge of the second power rail pattern to a second alignment boundary of the second-type active zone pattern, and wherein each of the first-type active zone and the second-type active zone is between the first alignment boundary thereof and the second alignment boundary thereof.

* * * * *